(12) United States Patent
Summey et al.

(10) Patent No.: US 11,943,869 B2
(45) Date of Patent: Mar. 26, 2024

(54) ELECTRICALLY FUNCTIONAL CIRCUIT BOARD CORE MATERIAL

(71) Applicant: KEMET Electronics Corporation, Fort Lauderdale, FL (US)

(72) Inventors: Brandon Summey, Simpsonville, SC (US); Peter A. Blais, Simpsonville, SC (US); Robert Andrew Ramsbottom, Simpsonville, SC (US); Jeffrey Poltorak, Simpsonville, SC (US); Courtney Elliott, San Jose, CA (US)

(73) Assignee: KEMET Electronics Corporation, Fort Lauderdale, FL (US)

( * ) Notice: Subject to any disclaimer, the term of this patent is extended or adjusted under 35 U.S.C. 154(b) by 303 days.

(21) Appl. No.: 17/163,648

(22) Filed: Feb. 1, 2021

(65) Prior Publication Data

US 2021/0243897 A1   Aug. 5, 2021

Related U.S. Application Data

(60) Provisional application No. 62/969,884, filed on Feb. 4, 2020.

(51) Int. Cl.
| | | |
|---|---|---|
| *H05K 1/11* | (2006.01) | |
| *H01G 9/045* | (2006.01) | |
| *H05K 1/03* | (2006.01) | |
| *H05K 1/18* | (2006.01) | |
| *H05K 3/30* | (2006.01) | |
| *H05K 3/46* | (2006.01) | |

(52) U.S. Cl.
CPC ............. *H05K 1/185* (2013.01); *H01G 9/045* (2013.01); *H05K 1/0393* (2013.01); *H05K 3/30* (2013.01); *H05K 3/4697* (2013.01); *H05K 2201/10015* (2013.01)

(58) Field of Classification Search
CPC ....................................................... H05K 1/185
USPC ......................................................... 174/260
See application file for complete search history.

(56) References Cited

U.S. PATENT DOCUMENTS

| | | | |
|---|---|---|---|
| 4,737,889 A * | 4/1988 | Nishino | ................. H01M 4/96 162/138 |
| 8,410,536 B2 | 4/2013 | Prymak et al. | |
| 10,863,627 B1 * | 12/2020 | Park | ...................... H05K 1/185 |
| 2006/0151836 A1 * | 7/2006 | Salcedo | ............ H01L 29/7436 257/362 |
| 2010/0043942 A1 | 2/2010 | Tanaka et al. | |

(Continued)

FOREIGN PATENT DOCUMENTS

WO    WO 2017/106700 A1    6/2017

*Primary Examiner* — Stanley Tso
(74) *Attorney, Agent, or Firm* — Joseph T. Guy; Patent Filing Specialist Inc.

(57) ABSTRACT

An improved circuit board core material, and method of making the circuit board core material, is provided wherein the circuit board core material is particularly suitable for use in a circuit board. The circuit board core material comprises a laminate. The laminate comprises a prepreg layer with a first clad layer on the prepreg layer wherein the prepreg layer comprises a pocket. An electronic component is in the pocket wherein the electronic component comprises a first external termination and a second external termination. The first external termination is laminated to, and in electrical contact with, the first clad layer and said second external termination is in electrical contact with a conductor.

48 Claims, 22 Drawing Sheets

(56) References Cited

U.S. PATENT DOCUMENTS

| | | | | |
|---|---|---|---|---|
| 2015/0264815 A1* | 9/2015 | Shimabe | ............... | H05K 1/185 |
| | | | | 29/25.41 |
| 2016/0329156 A1* | 11/2016 | Chacko | .................... | H01G 9/15 |
| 2017/0169957 A1* | 6/2017 | Naito | .................... | H01G 9/0036 |
| 2018/0211790 A1* | 7/2018 | Hahn | ....................... | H01G 9/15 |
| 2019/0392997 A1* | 12/2019 | Takahashi | ................ | H01G 9/07 |

* cited by examiner

ELECTRICALLY FUNCTIONAL CIRCUIT BOARD CORE MATERIAL

CROSS-REFERENCE TO RELATED APPLICATIONS

This application claims the priority of U.S. Provisional Patent Application No. 62/969,884 filed Feb. 4, 2020 which is incorporated herein by reference.

FIELD OF THE INVENTION

The present invention is related to a circuit board core material comprising embedded functional components, particularly embedded capacitors, wherein the embedded functional components are within the structure of the circuit board core material.

BACKGROUND

There is an ongoing demand for miniaturization in electronics. In conflict with the demand for miniaturization is the demand for increased functionality within a given space, increased power and decreased cost.

Part of the effort to achieve these contradictory goals is the ongoing search for real estate within an electronic circuit which can be repurposed. The circuit board, for example, has a thickness and breadth which has long been considered suitable for adding functionality. There has been a significant amount of effort attempting to utilize the space within the circuit board, however, accessing the functionality has typically required the formation of vias, particularly blind vias, after incorporation of the component within the circuit board which increases manufacturing steps and cost. The formation of vias also has associated therewith quality control concerns which also increases manufacturing cost.

Other approaches have focused on building in functionality as a circuit board is manufactured. Layers of conductor, for example, separated by an insulating layer can provide capacitance, however the cost of manufacturing the circuit board increases significantly and vias are still required to access the functionality. It is also difficult to make generic structures which can be altered later to accommodate different electrical circuit designs.

In spite of the ongoing effort there is still a desire in the art for a circuit board core material with built in functionality, based on embedded components, which can be manufactured economically, and which does not require vias to access the functionality after manufacture of the circuit board core material.

SUMMARY OF THE INVENTION

It is an object of the invention to provide a circuit board core material comprising an embedded electronic component.

A particular feature of the invention is the ability to provide a circuit board core material comprising an embedded electronic component wherein the electronic component can be electrically connected at the surface without necessity of forming vias, particularly blind vias, after preparation of the circuit board core material.

These, and other advantages, as will be realized, are provided in a circuit board core material comprising a laminate. The laminate comprises a prepreg layer with a first clad layer on the prepreg layer wherein the prepreg layer comprises a pocket. An electronic component is in the pocket wherein the electronic component comprises a first external termination and a second external termination. The first external termination is laminated to, and in electrical contact with, the first clad layer and said second external termination is in electrical contact with a conductor.

Yet another embodiment is provided in a circuit board comprising a primary laminate. The primary laminate comprises a circuit board core material layered with circuit board material wherein the circuit board material is laminated to the circuit board core material to form the primary laminate. The circuit board core material comprises a laminate a prepreg layer with a first clad layer on a first side of said prepreg layer. The prepreg layer comprises a pocket and an electronic component in the pocket wherein the electronic component comprises a first external termination and a second external termination. The first external termination is laminated to and in electrical contact with the first clad layer and the second external termination is in electrical contact with a conductor.

Yet another embodiment is provided in a method of making a circuit board core material. The method includes:
  providing a laminate comprising prepreg and at least one clad layer one side of the prepreg;
  forming a pocket in the prepreg;
  inserting an electronic component in the prepreg wherein the electronic component comprises a first external termination and a second external termination;
  curing the prepreg to form prepreg with the electronic component in the prepreg; forming a first electrical connection by laminating the first external termination to the first clad layer; and forming a second electrical connection to the second external termination.

DESCRIPTION

The present invention is related to improved volumetric efficiency in electronic components and particularly to improvements in the use of embedded components in a circuit board. More specifically the present invention is a related to a circuit board core material which can be utilized in the construction of a circuit board that eliminates the need for manufacturing or forming vias after manufacturing to electrically connect cladding of the circuit board core material to the embedded electronic component.

The instant invention provides a circuit board core material that is usable in the construction of a printed circuit board as a single layer circuit board or a multilayer circuit board. The circuit board core material includes an electronic component incorporated in the core thereof with a capacitor being a particularly preferred electronic component. In an embodiment the cathode and anode layers of the capacitor are substantially planer and in electrical contact with, preferably copper, clad layers of the circuit board core material.

As will be realized from the description herein the instant invention provides several features not currently available in the art. Pass through regions can be incorporated and later accessed to provide vias from one face of the circuit board to the other. The vias are not required to access the embedded functionality but are used as is common in the art of circuit design to electrically connect traces and electronic components mounted on or to the circuit board.

Another feature is an advantage in thickness wherein the inventive circuit board core material has a thickness which does not exceed that of the prepreg forming the core. The thickness advantage provides significant volumetric efficiency since additional functionality is incorporated in existing space.

The inventive circuit board can be manufactured with internal electrical components having a high surface area to thickness ratio which is particularly advantageous for reducing inductance and impedance.

The invention will be described with reference to the figures which form an integral, non-limiting, component of the disclosure. Throughout the various figures similar elements will be numbered accordingly.

Figure 1:
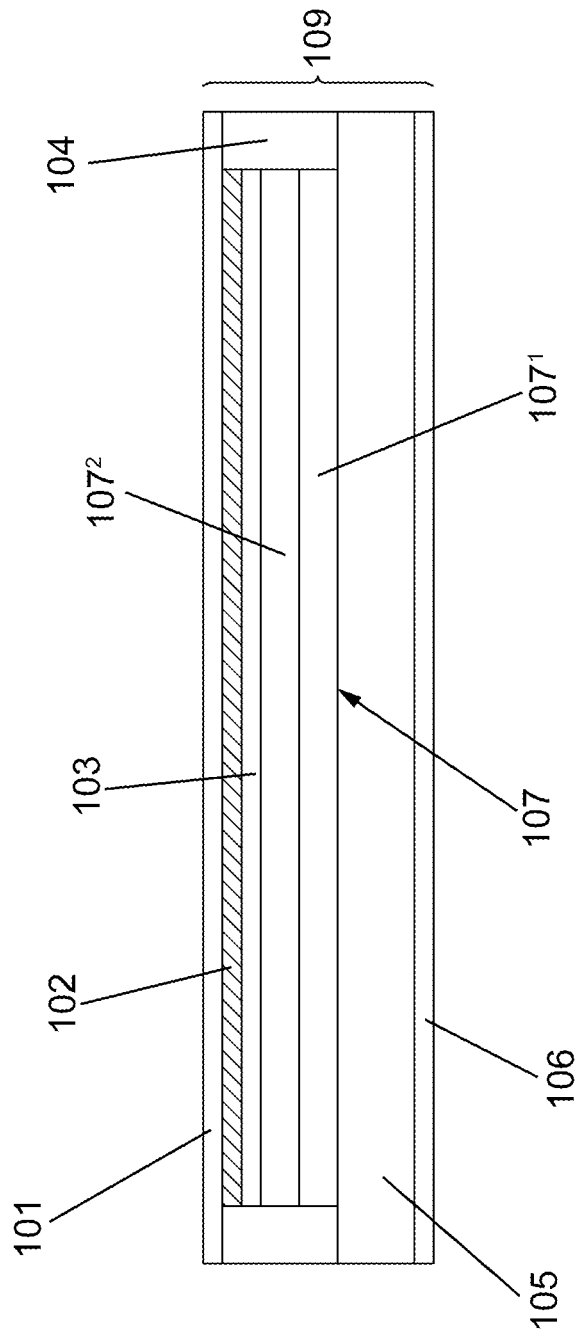
FIG. 1 is a cross sectional schematic view of a two-sided capacitor element.

An embodiment of the invention will be described with reference to FIG. 1 which is a cross sectional schematic view of a valve metal capacitor foil, referred to as a foil capacitor, suitable for use as a capacitor element, 109, in the invention. The valve metal capacitor foil comprises a capacitor core, 105, and a porous valve metal layer, 107, on the capacitor core. The porous valve metal layer comprises a porous layer of valve metal, $107^1$ with a dielectric, $107^2$, formed on the porous surface of the valve metal. An external conductive counter electrode material, 103, forms the counter electrode to the valve metal. The external conductive counter electrode material, 103, comprises a conductive material which impregnates the porous layer of the valve metal layer wherein the external conductive counter electrode material is on the external surface of dielectric, and electrically isolated from the valve metal by the dielectric. A conductive paint, 102, is preferably present on the external conductive counter electrode material. This conductive paint typically comprises carbon filled resin and a metal filed resin or a combination thereof without limit thereto. A metalized cathode layer, 101, is provided, preferably on the outer surface of the conductive paint layer which functions as the first external termination for the electronic component represented in this example as the cathode termination of a capacitor. The metalized cathode layer, 101, and conductive paint layer, 102 are optional but preferred. The conductive material impregnating the valve metal layer and the external conductive counter electrode material, 103, are typically chosen from a conductive polymer or manganese dioxide for valve metal capacitors without limit thereto. The external conductive counter electrode material, conductive paint, and metalized cathode layer are collectively referred to as the cathode and the materials therein as the cathode materials. An optional but preferred isolation material, 104, is provided around the perimeter of the capacitor component. This isolation material forms a region of electrical isolation between the cathode and anode regions which are not otherwise electrically isolated by the dielectric. The external conductive counter electrode material, 103, conductive paint, 102, and metalized cathode layer, 101, may be present on any portion of the isolation material, 104. The isolation material, 104 may also be above, below, or in plane with any surface of the capacitor element, 109. Bonded to the capacitor core, 105, is an optional but preferred anode conductive layer, 106. The anode conductive layer functions as the second external termination of the electronic component which is an anode termination when the electronic component is a capacitor as used for the purposes of illustration. The anode conductive layer is electrically attached to the capacitor core, 105. The porous valve metal, capacitor core and anode conductive layer are collectively referred to as the anode and the materials therein as anode materials. For demonstration of the invention copper is a particularly suitable material for use as the anode conductive layer, 106, without limit thereto.

Figure 2:
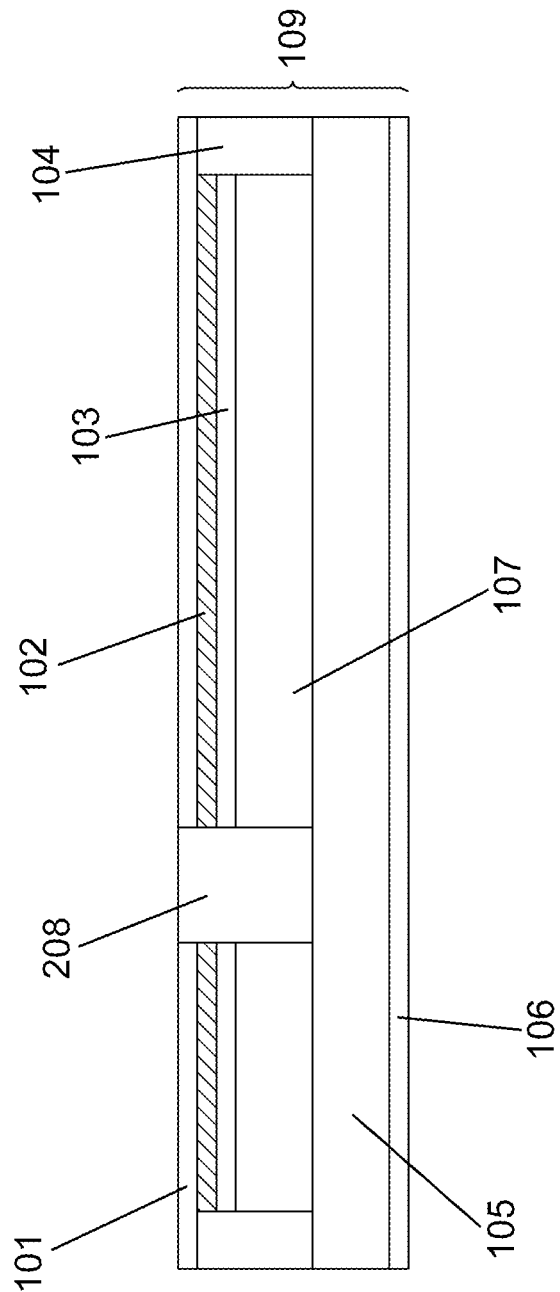
FIG. 2 is a cross sectional schematic view of a two-sided capacitor element with an anode passthrough.

An embodiment of the invention will be described with reference to FIG. 2 which is a cross sectional schematic view of a valve metal capacitor as a capacitor element, 109. FIG. 2 includes elements from FIG. 1 and further includes an anode isolating region, 208. The anode isolating region is typically, but not limited to, an isolating material that prevents cathode material from intersecting a region of the capacitor when anode connecting vias intersect the capacitor element as will be discussed elsewhere herein. The anode isolating region may be formed from an electrically insulating material, as illustrated in FIG. 2, or the anode isolating region may be formed by a vacancy of cathode material, or by the presence of other materials, as long as the anode isolating region prevents electrical connectivity of the anode via to the cathode layers of the device if a via is formed through the anode isolating region.

Figure 3:
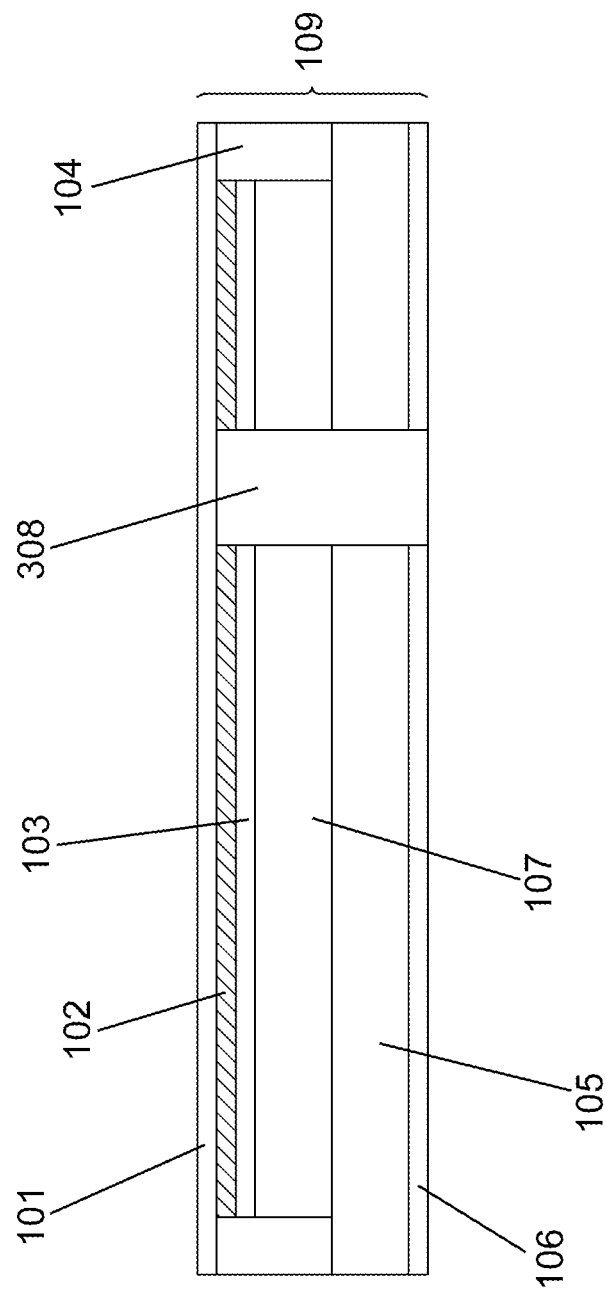
FIG. 3 is a cross sectional schematic view of a two-sided capacitor element with a cathode passthrough.

An embodiment of the invention will be described with reference to FIG. 3 which is a cross sectional schematic view of a valve metal capacitor as a capacitor element, 109. FIG. 3 includes elements from FIG. 1 and additionally includes a cathode isolating region, 308. The cathode isolating region is typically, but not limited to, an electrically insulating material that prevents anode material from electrical connectivity with the cathode connecting when vias are subsequently formed through the cathode isolating region as will be discussed further herein. The isolating region may be formed by an electrically insulating material, as illustrated in FIG. 3, may be formed by the absence of anode material, or may be formed by other materials other than an isolating material as long as the cathode isolating region prevents the electrical connection of the cathode and anode when subsequent vias are formed.

Figure 4:
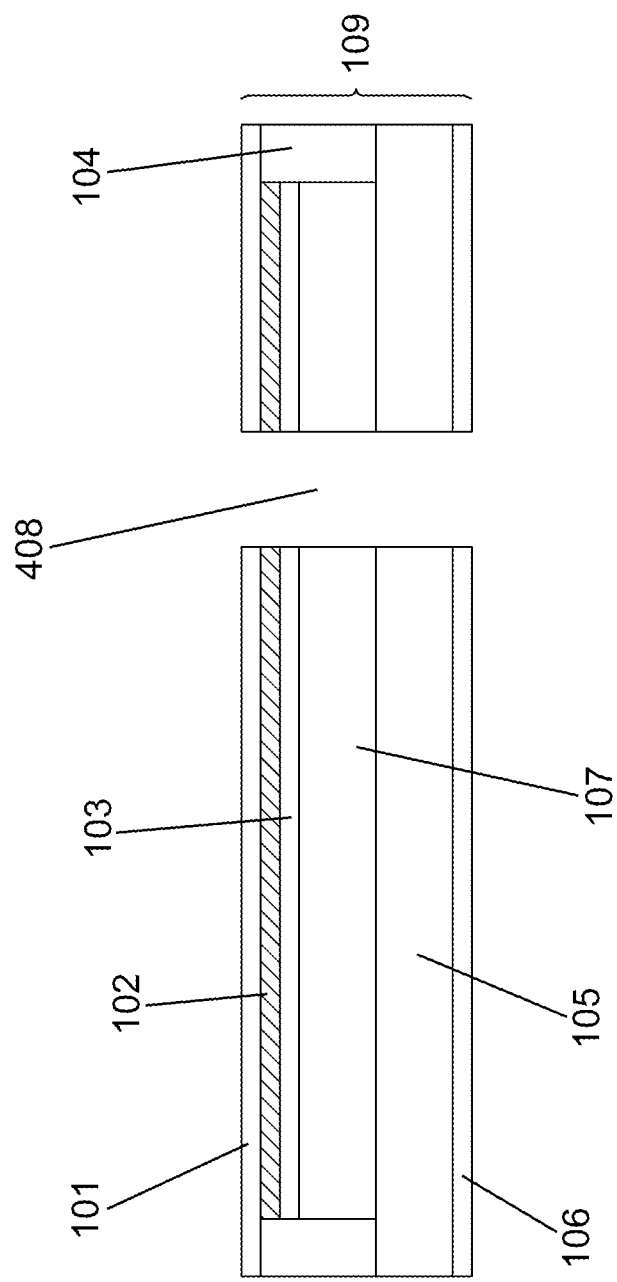
FIG. 4 is a cross sectional schematic view of a two-sided capacitor element with a non-electrical passthrough.

An embodiment of the invention will be described with reference to FIG. 4 which is a cross sectional schematic view of a capacitor element, 109. FIG. 4 includes elements from FIG. 1 and additionally includes a via pass through region, 408. The via pass through region is preferably, but not limited to, an isolating material that prevents electrical connectivity between the anode and cathode when pass through vias are subsequently formed through the via pass through region as part of subsequent construction of a circuit board.

Figure 5:
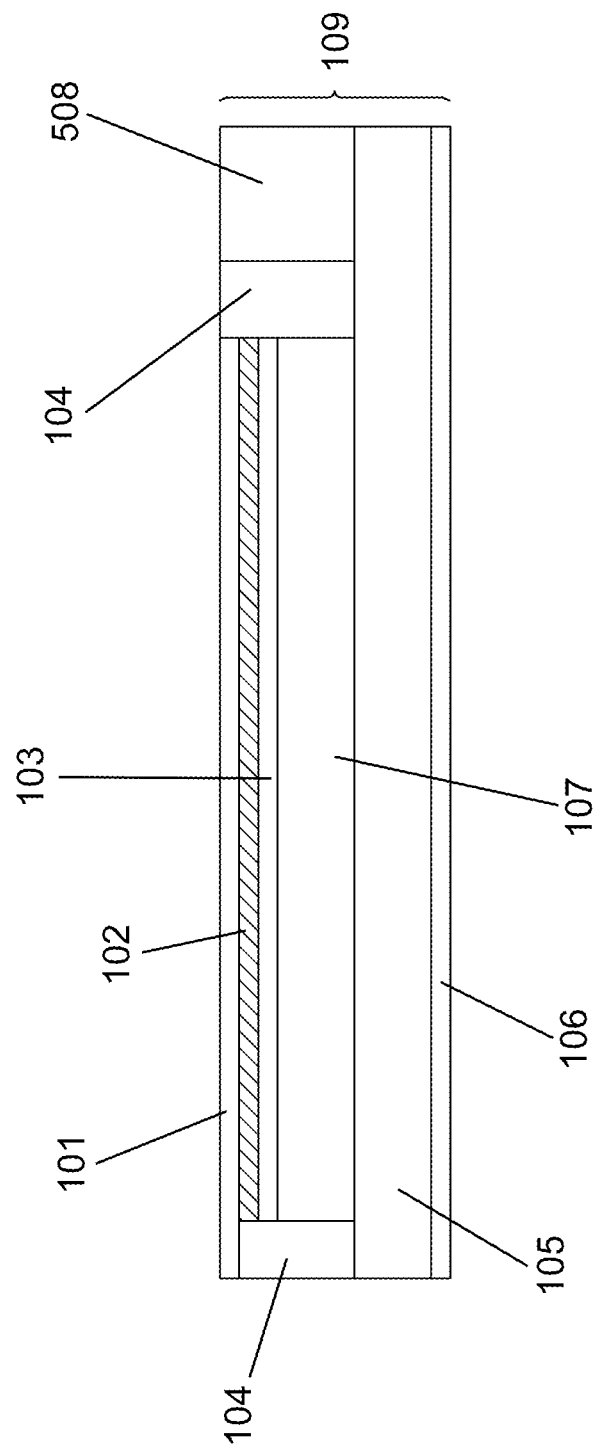
FIG. 5 is a cross sectional schematic view of a one-sided capacitor element.

An embodiment of the invention will be described with reference to FIG. 5 which is a cross sectional schematic view of a one-sided valve metal capacitor as the capacitor element, 509. FIG. 5 includes elements from FIG. 1 and additionally includes an anode conductive node, 508, that is substantially planar with the cathode conductive layer, 501, and functions as a second external termination. This facilitates the formation of a circuit board core material that has both anode and cathode connections on the same core clad layer.

Figure 6:
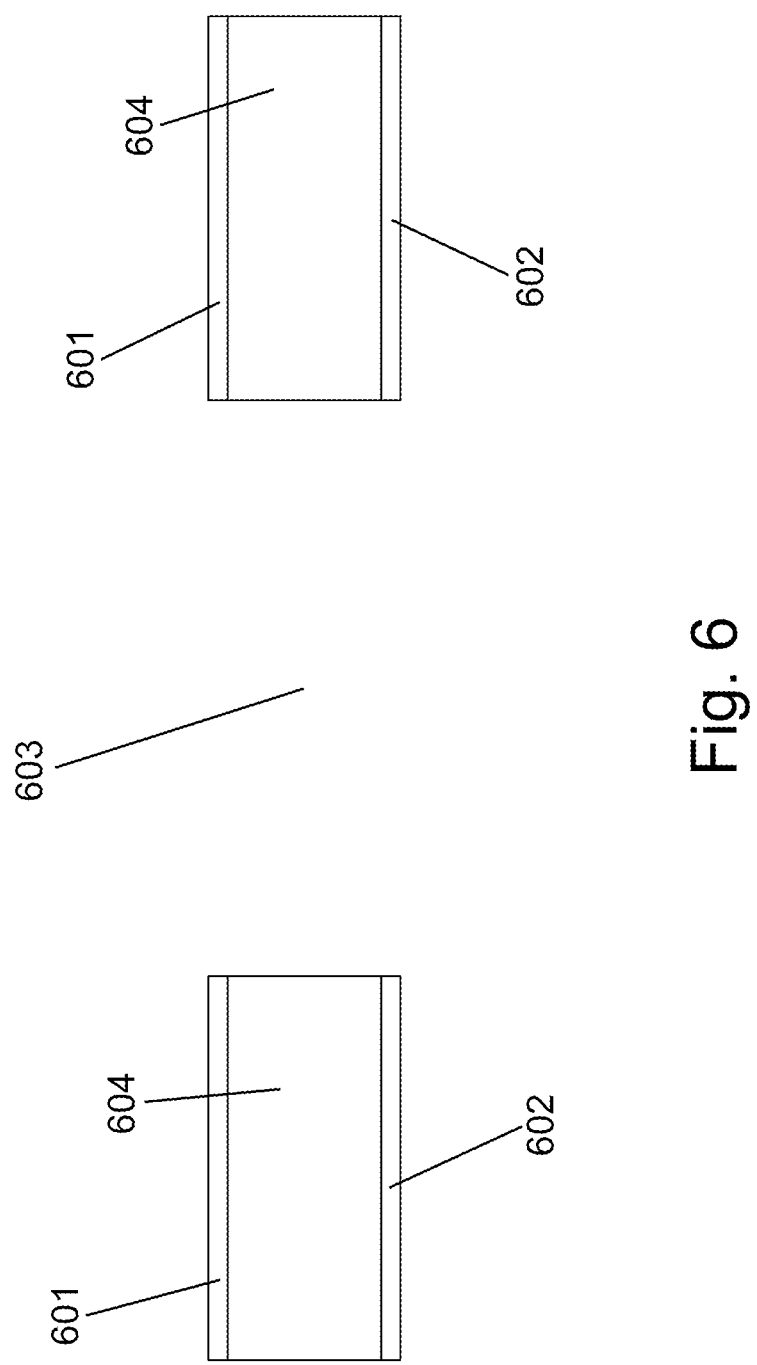
FIG. 6 is a cross sectional schematic view of a representation of the precursor resin system and copper clad layers before the capacitor element is bonded.

An embodiment of the invention is described with reference to FIG. 6 which is a cross sectional schematic view of prepreg layers, 604 and, preferably copper, clad layers, 601 and 602, which will form the circuit board core material with the electronic component embedded therein. Prepreg with clad layers is widely available in the art and widely used in commerce and therefore further description is not warranted since the choice of prepreg and cladding materials is not particularly limited. Prepreg material such as supplied by Isola is particularly suitable for demonstration of the invention without limit thereto. One advantage of the present invention is the ability to utilize commercial materials that are currently used in the formation of printed circuit board core material. These printed circuit board cores are pre-manufactured components used to make printed circuit boards. They include resin or resin-glass systems such as prepreg, 604, in an uncured state with foils, preferably copper foils on the exterior surface thereof referred to as clad layers or cladding. The printed circuit board core and clad are cured together to form a sandwich comprising two copper plates separated by the cured prepreg core. As part of the method of constructing the present invention it is ideal to use materials of common construction. To facilitate the inclusion of the capacitor elements a pocket, 603, is formed in at least a portion of the prepreg, 604. An additional embodiment includes removing a portion of the clad layers, 601 and 602, to form the pocket.

Figure 7:
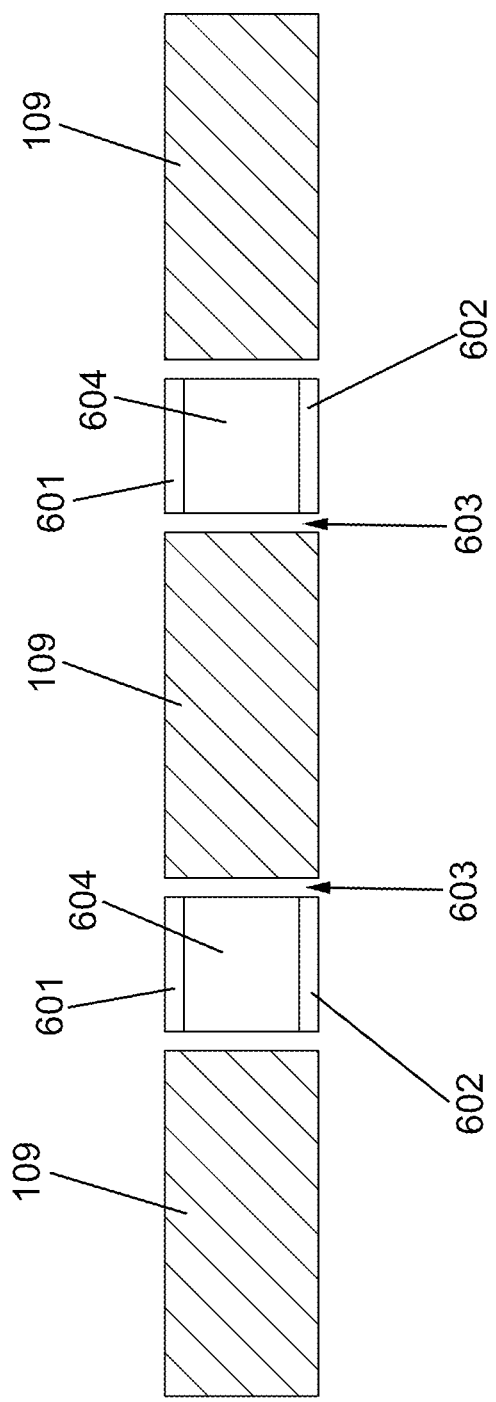
FIG. 7 is a cross sectional schematic view of a two-sided capacitor element placed within the precursor resin system and copper clad layers.

An embodiment of the invention will be described with reference to FIG. 7 which is a cross sectional schematic view of prepreg layers, 604 and, preferably copper, clad layers, 601 and 602 with multiple capacitor elements, 109, inserted in the pockets, 603.

Figure 8:
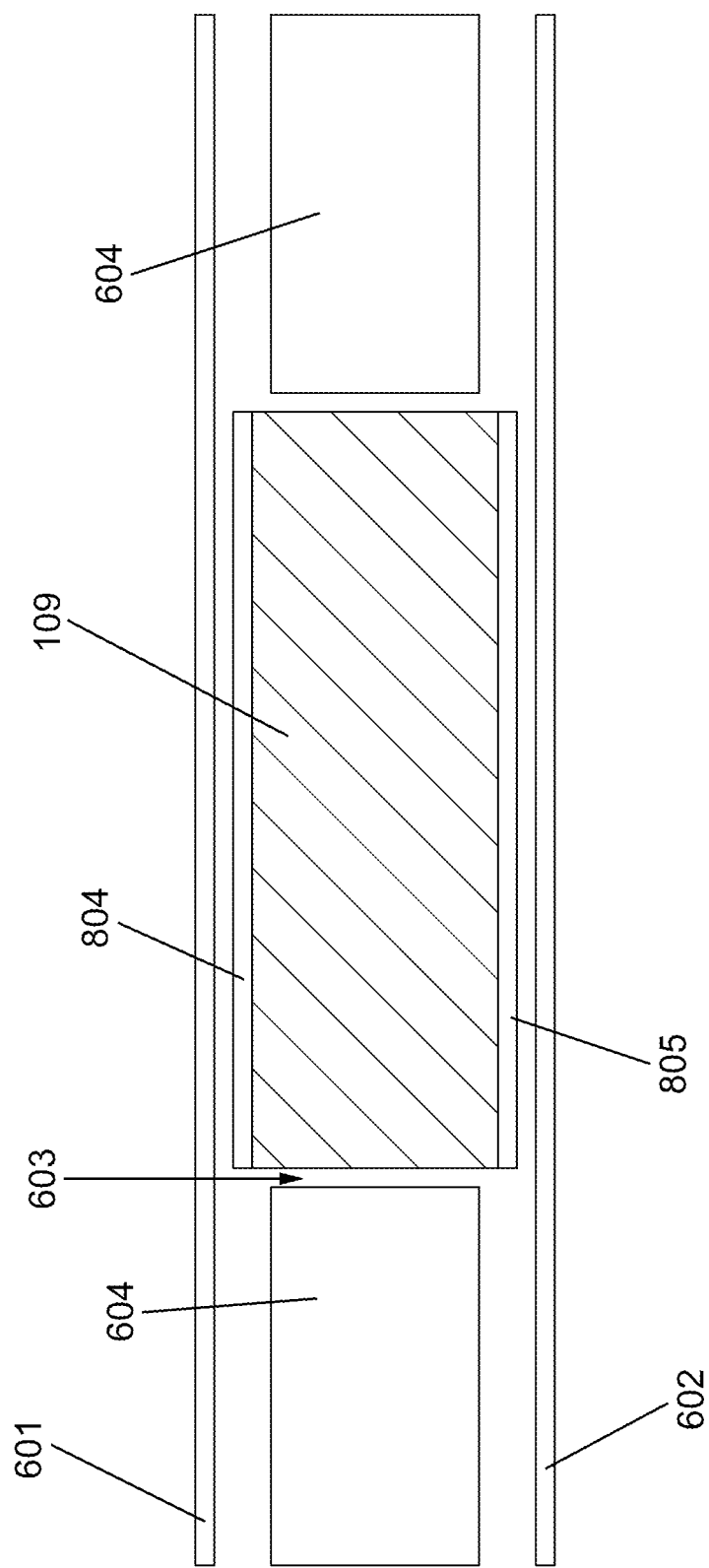
FIG. 8 is a cross sectional schematic view of a two-sided capacitor element placed within the precursor resin system and copper clad layers of a construction variant.

An embodiment of the invention will be described with reference to FIG. 8 which is a cross sectional schematic exploded view of prepreg layers, 604, and, preferably copper, clad layers, 601 and 602, with the capacitor element, 109, between the two clad layers, 601 and 602, and in the pocket, 603. Clad bonding layers, 804 and 805, are attached to the capacitor element, 109. The clad bonding layer bonds to the respective copper clad layers, 601 and 602 to form a laminate. This bonding can occur, but is not limited to, when the prepreg system is cured forming a physical bond between the capacitor element, 109, and the prepreg, 604. During this curing step clad bonding layers, 804 and 805, can also electrically bond the capacitor element, 109, to the clad layers, 601 and 602.

Figure 9:
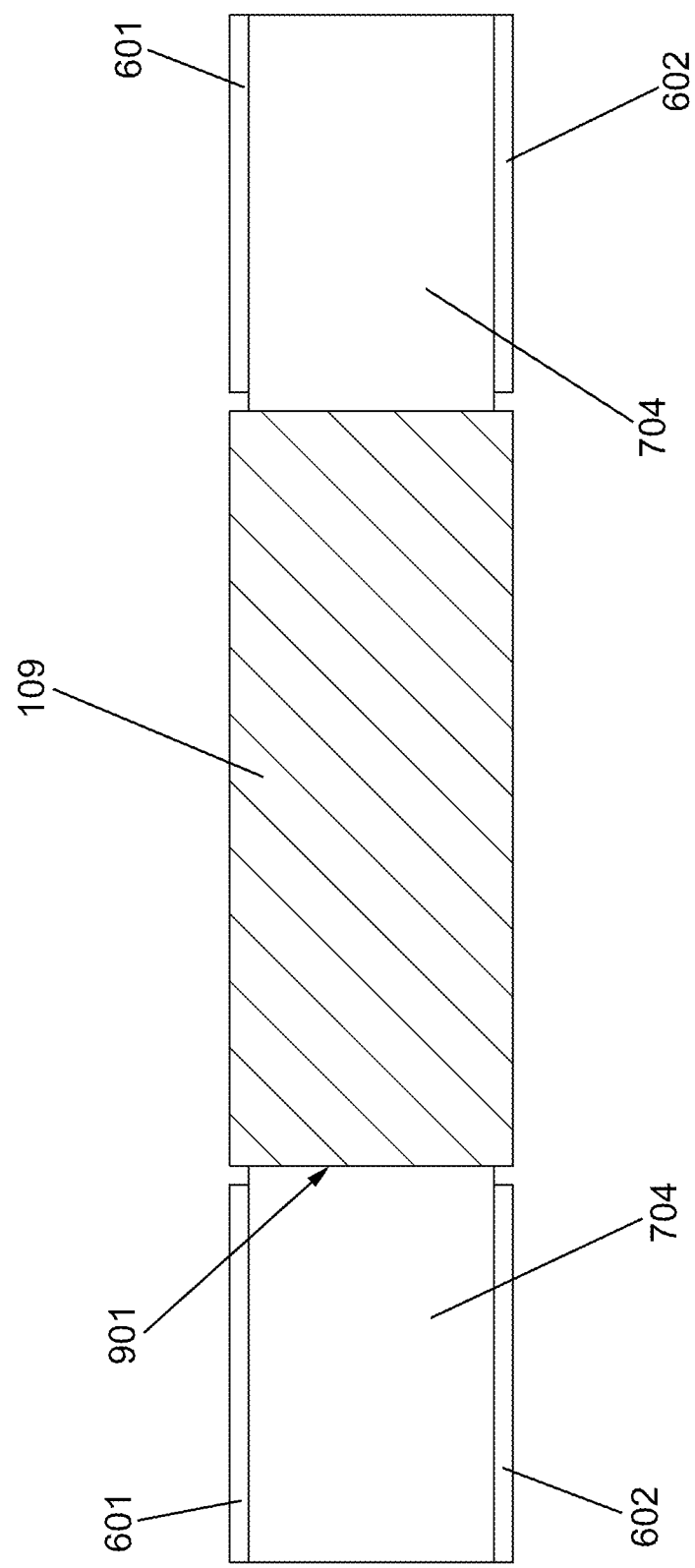
FIG. 9 is a cross sectional schematic view of a two-sided capacitor element bonded with the resin system and copper clad layers.

An embodiment of the invention will be described with reference to FIG. 9 which is a cross sectional schematic view of a precursor to the circuit board core material. In FIG. 9 the components in FIG. 7 are illustrated after curing to from a laminate. The cured prepreg, 704, has flowed and physically bonded with the capacitor element, 109, at 901 to secure the capacitor element, bond the clad layers, 601 and 602, and form a physical barrier around the perimeter of the capacitor between the cathode side of the capacitor element and the anode side of the capacitor element. The clad layers may be separated or in contact with the capacitor element at this stage.

Figure 10:
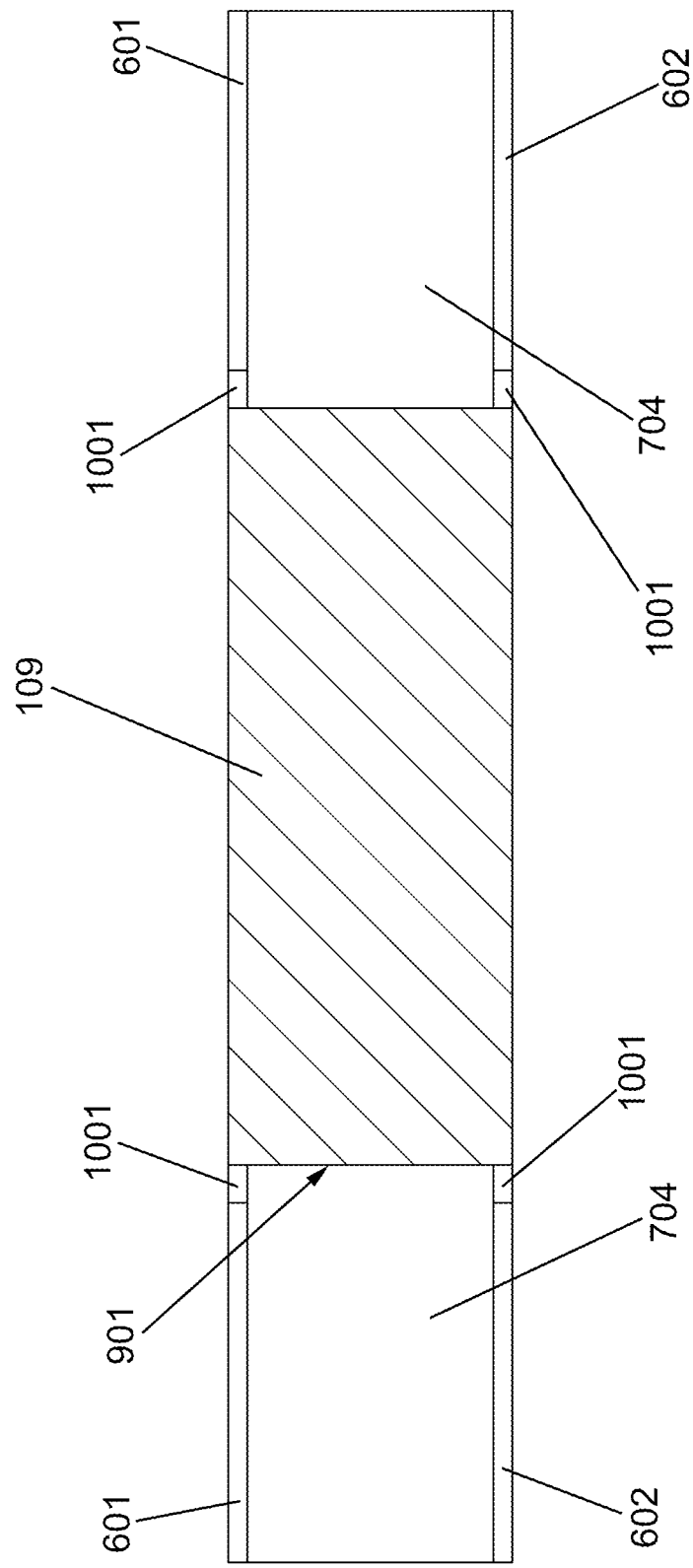
FIG. 10 is a cross sectional schematic view of a two-sided capacitor element bonded with the resin system and copper clad layers additionally showing an electrical connection between the clad layers and capacitor layers.

An embodiment of the invention will be described with reference to FIG. 10 which is a cross sectional schematic view of a precursor to the circuit board core material. The components of FIG. 9 are included with the added feature of an electrical connection layer, 1001, between the clad layers, 601 and 602, and laminated to the capacitor element, 109.

Figure 11:
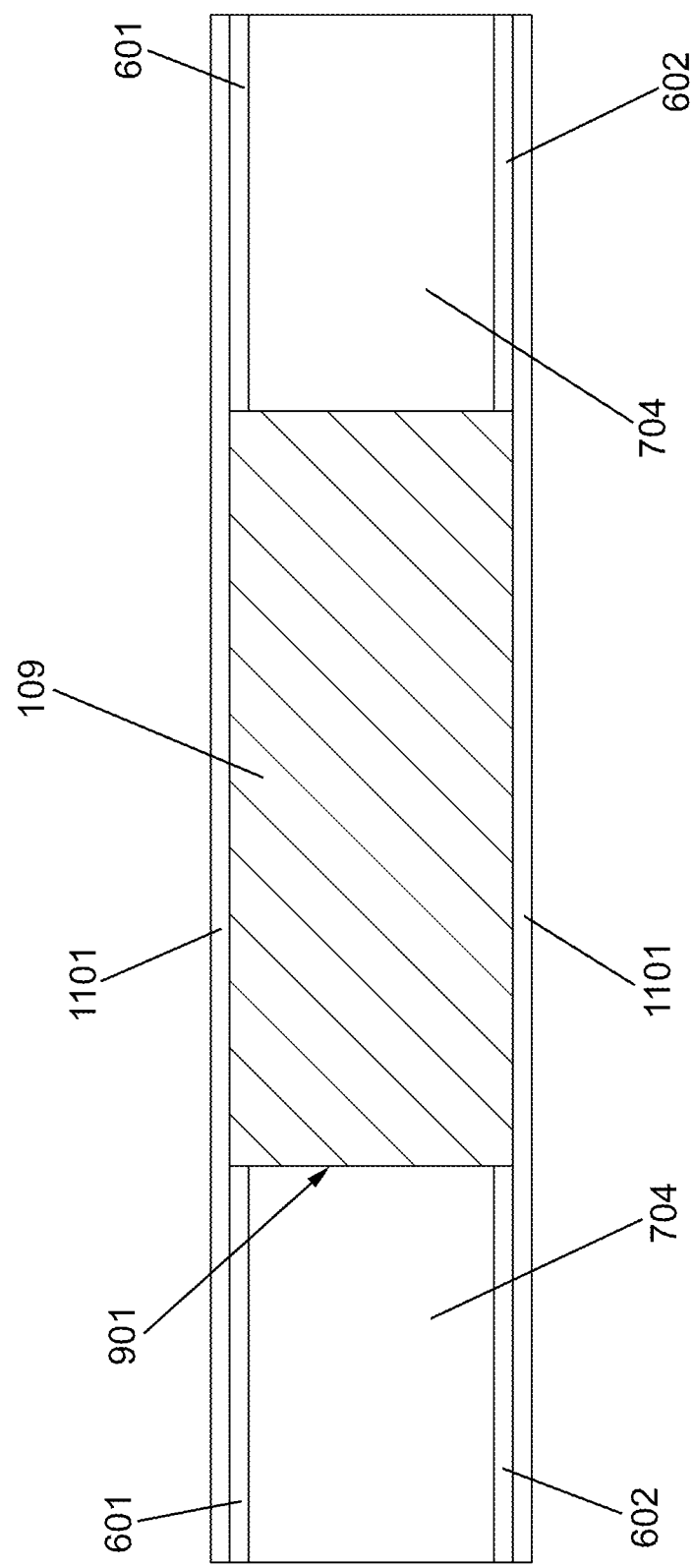
FIG. 11 is a cross sectional schematic view of a two-sided capacitor element bonded with the resin system and copper clad layers with continuous cathode and anode outer layers.

An embodiment of the invention will be described with reference to FIG. 11 which is a cross sectional schematic view of a circuit board core material. The components of FIG. 9 are included with the variant of an added feature of an electrical connection layer, 1101, between the copper clad layers, 601 and 602, and the capacitor element, 109. In this embodiment the electrical connection layer, 1101, is a layer formed over the entire surface of both the copper clad layers, 601 and 602, and the capacitor element, 109.

Figure 12:
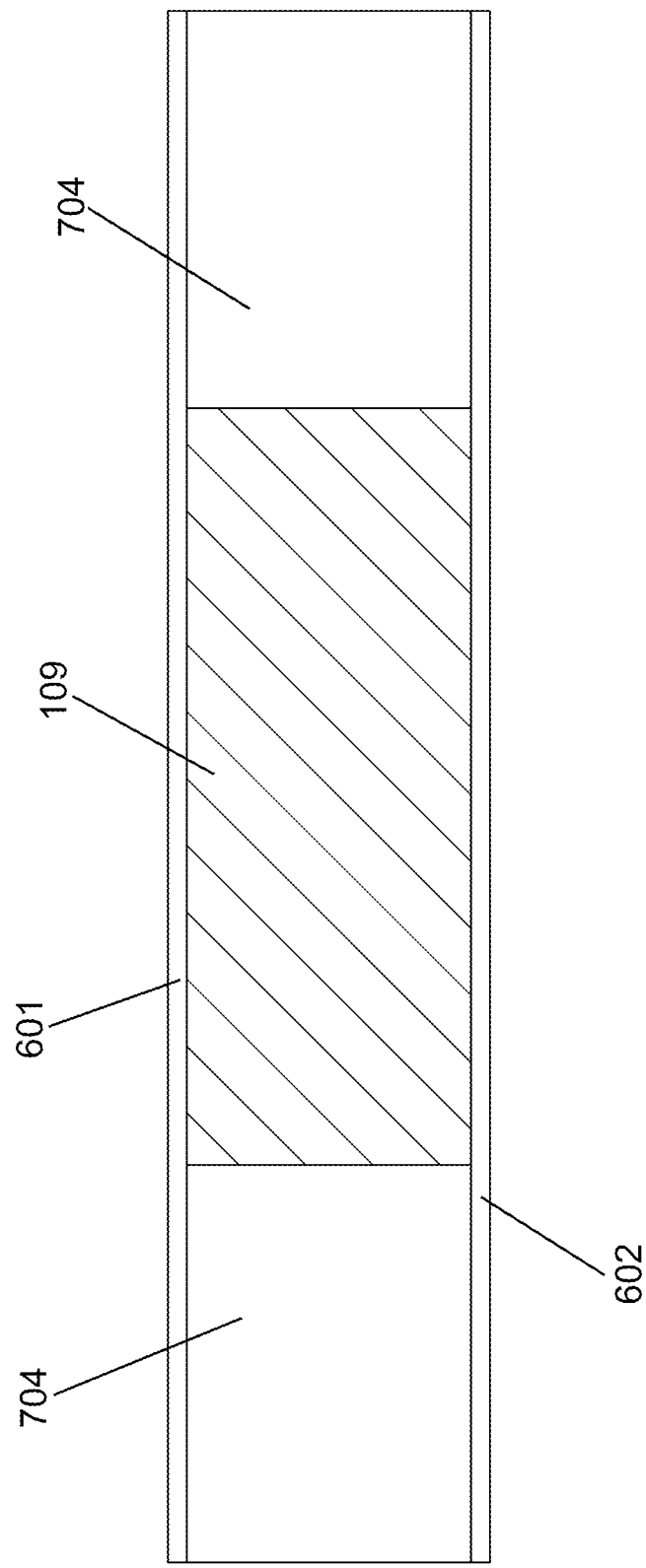
FIG. 12 is a cross sectional schematic view of a f circuit board core material.

An embodiment of the invention will be described with reference to FIG. 12 which is a cross sectional schematic view of a capacitor. The capacitor element, 109, is physically bonded to the cured prepreg, 704, and the anode and cathode portions of the capacitor element, 109, are laminated to and electrically connected to the clad layers, 601 and 602.

Figure 13:
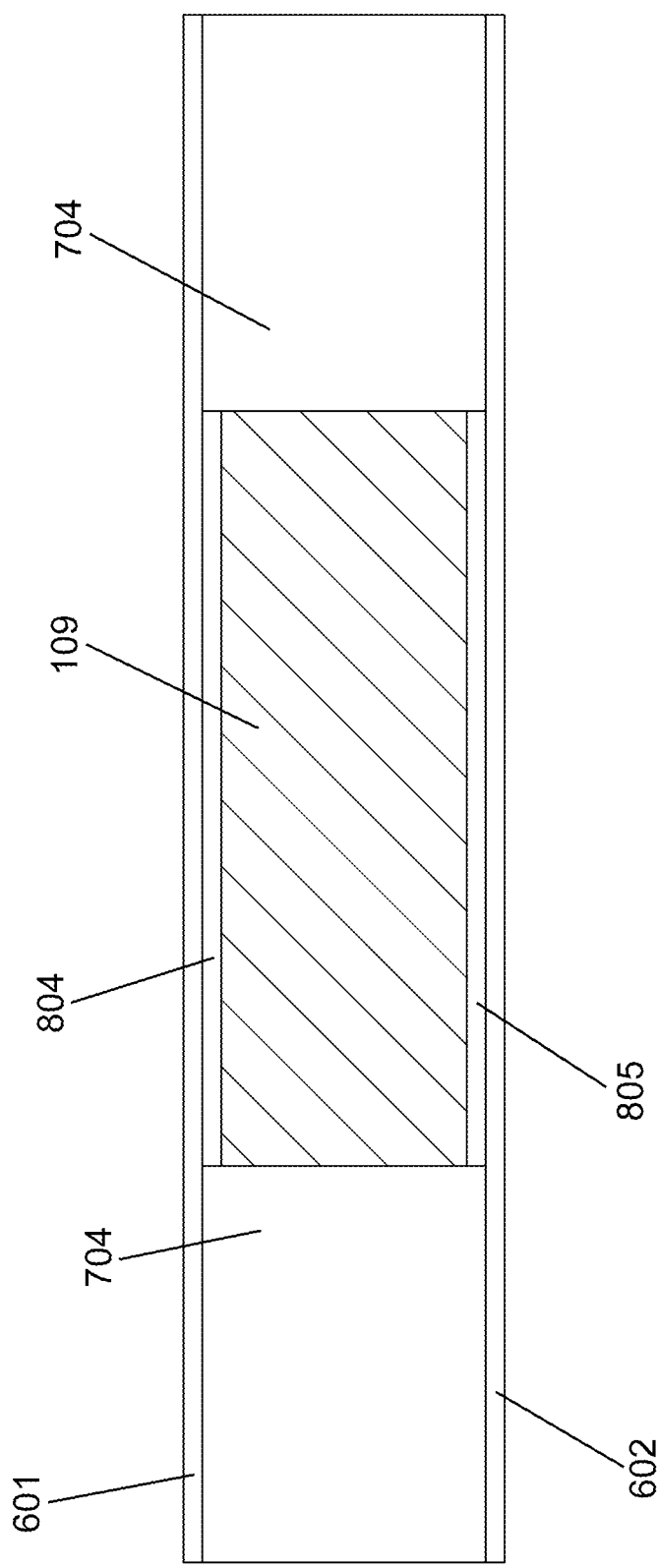
FIG. 13 is a cross sectional schematic view of a circuit board core material.

An embodiment of the invention will be described with reference to FIG. 13 which is a cross sectional schematic view of a capacitor. The capacitor element, 109, is physically bonded to the cured prepreg, 704, and the anode and cathode portions of the capacitor element, 109, are electrically laminated to the copper clad layers, 601 and 602, through the clad bonding layer, 804 and 805. It is preferable that the clad bonding layers, 804 and 805, are bonded physically and electrically to the capacitor element, 109, as a laminate during the prepreg lamination or curing step without limit thereto. It would be understood by those of skill in the art that the clad bonding, 804 and 805, could be formed on the copper clad layers, 601 and 602, or on the capacitor element, 109, prior to forming the sandwiched arrangement or materials could be included as separate layer not bonded to either the clad layer or capacitor element until lamination.

Figure 14:
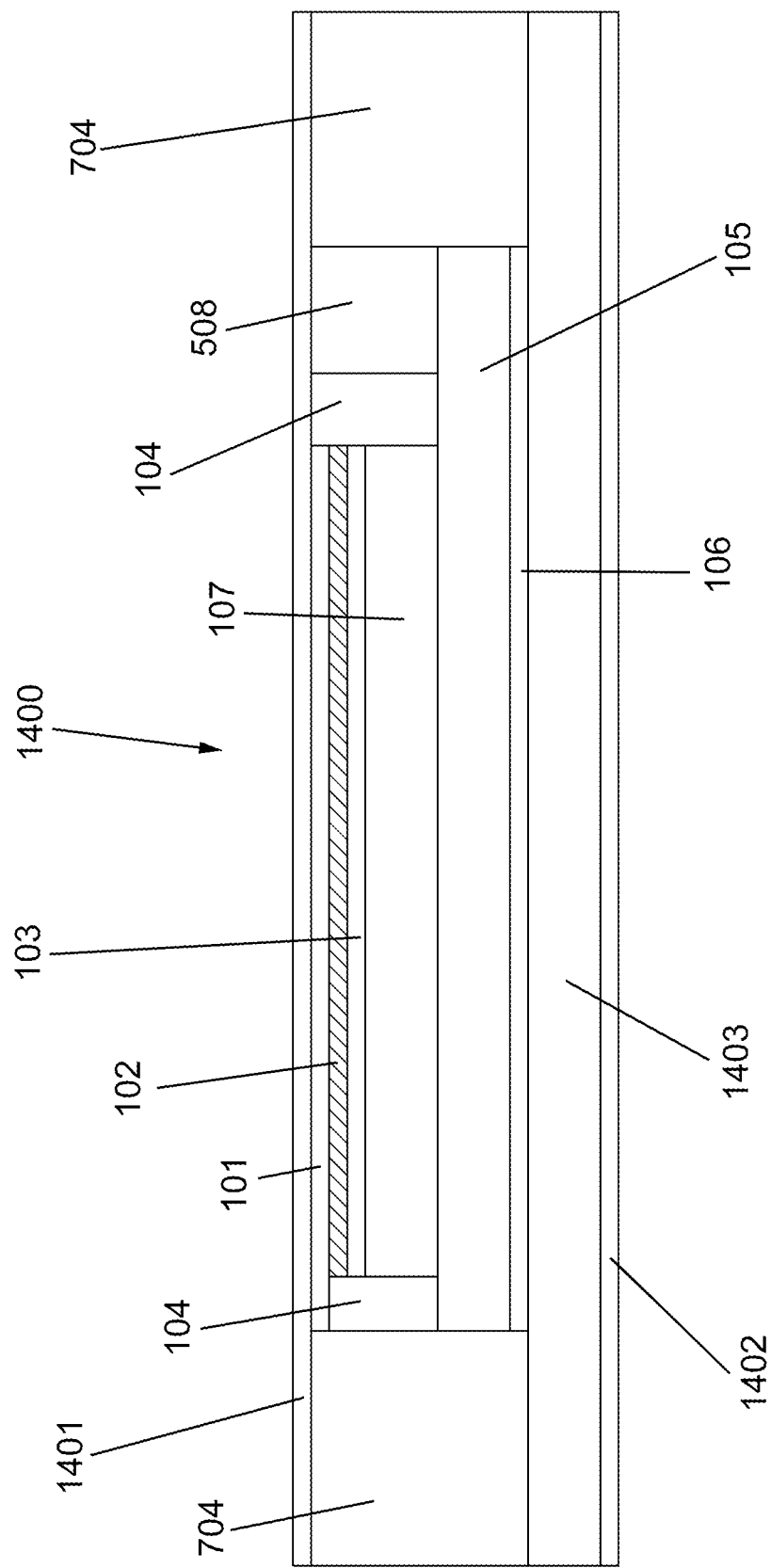
FIG. 14 is a cross sectional schematic view of a circuit board core material.

An embodiment of the invention will described with reference to FIG. 14 which is a cross sectional schematic view of a circuit board core material, 1400. In FIG. 14 the circuit board core material provides electrical connection for the anode and cathode sides of capacitor element, 109, to the same clad layer, 1401. The clad layer, 1402, may or may not be connected to either the anode or cathode or both of the capacitor element, 109. An additional layer of prepreg, 1403, may also be present in the laminate to prevent electrical connection to either side of the capacitor element, 109. As would be realized to those of skill in the art the clad layer, 1401, would be etched during the process of trace formation to insure the cathode and anode are not in electrical contact. Clad layer, 1402 may also be omitted as preferred if appropriate for the final use of the circuit board core material.

Figure 15:
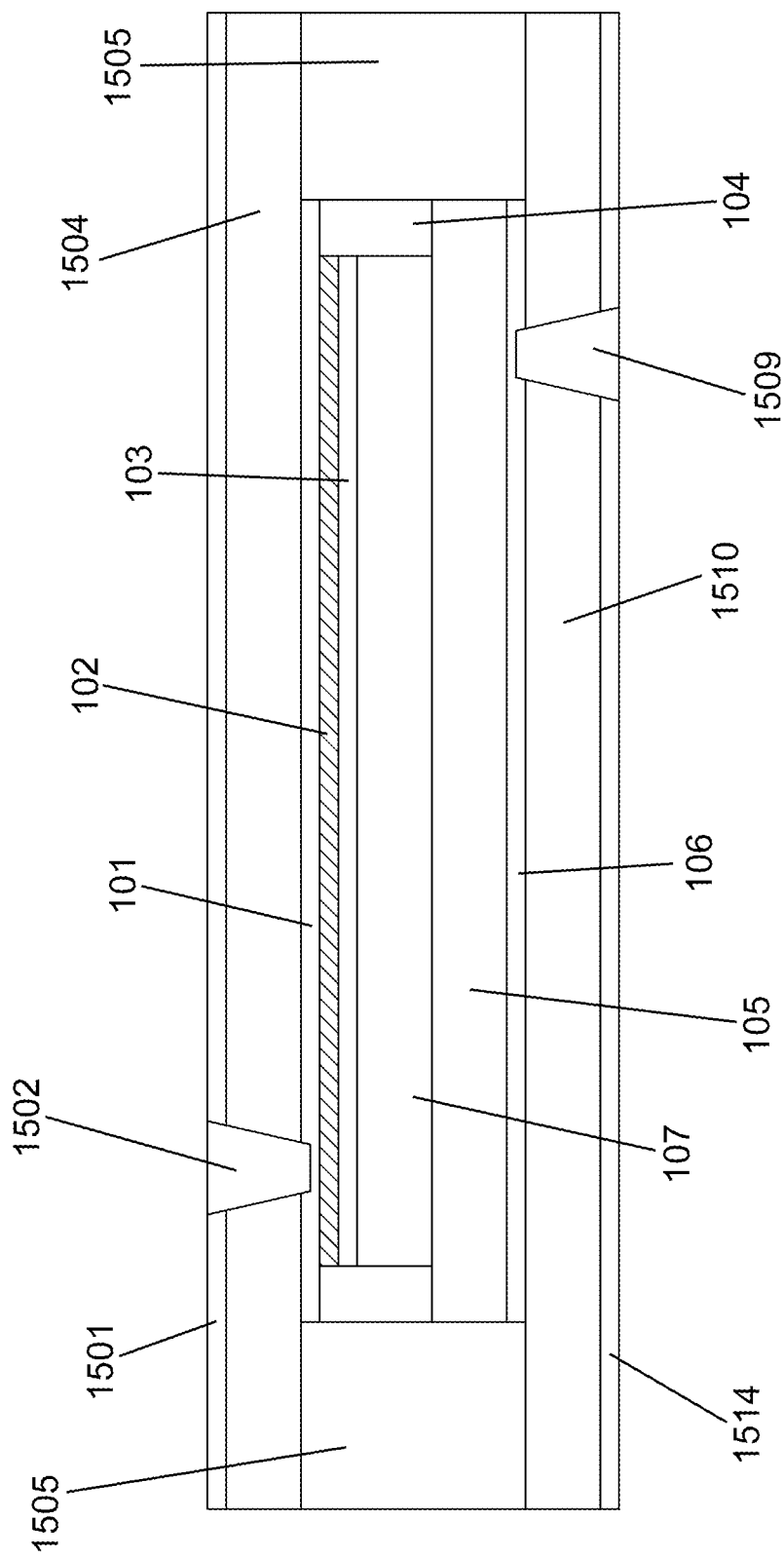
FIG. 15 is a cross sectional schematic view of a prior art example of embedded valve metal capacitors.

A prior art version embedded capacitor will be described with reference to FIG. 15. In FIG. 15 the capacitor element is laminated between two layers of cured prepreg material 1504 and 1510. This could be formed by using two or more opposing layers of uncured prepreg, wherein, when laminated the capacitor element, 109, the resin from the prepreg flows around the element to join with the prepreg resin from the opposite side. Thus, forming a capacitor embedded in the cured prepreg material. An alternative method is to form a pocket in a previously laminated prepreg, 1505, such that the capacitor element, 109, is placed in the pocket. This prepreg pocket would be encapsulating of the capacitor element and would prevent electrical or physical connection. An additional layer of prepreg would be laminated in a adjacent to other prepreg materials to form a layer capping the original pocket and embedding the capacitor element. In either method of embedding the capacitor element, vias must be drilled to intersect with the cathode or anode portions of the capacitor element. Without considering a present embodiment of this invention this via must be drilled from the outside of the formed layers and stop when it intersects the first layer of the capacitor element. This is called blind via drilling. Material must be applied into these vias, 1509 and 1502, to form an electrical connection with the capacitor and the copper clad layers, 1501 and 1514. Typically, this is done with plating or conductive paste. The new layers of material can then be pattern etched to form traces and subsequent processes applied. This is undesirable from several aspects in relation to the present invention. The via processing requires an added step to create an electrical connection to the capacitor elements. The processes used to form the electrical connection to capacitor material specifically may be undesirable on a customer level as those processes being currently well defined but potentially incompatible with the capacitor materials. Additionally, the added thickness resulting from prepreg layers being applied to the cathode and anode faces of the capacitor reduces the volumetric efficiency of the device. In the prior art device the capacitors are fully encompassed in the cured prepreg material to protect it from processing materials. The present invention eliminates a portion of those prepreg layers between the copper clad layers and the capacitor element.

Figure 16:
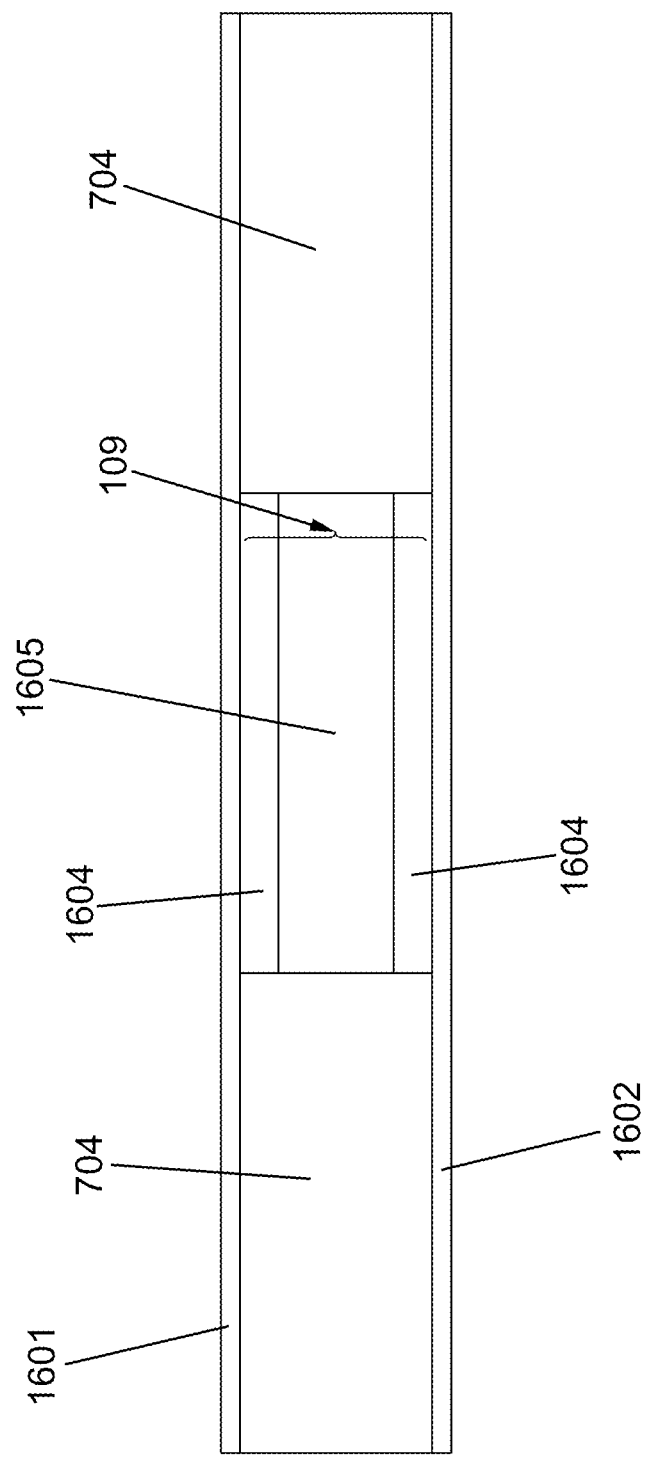
FIG. 16 is a cross sectional schematic view of an example of a circuit board core material comprising a ceramic capacitor.

An embodiment of the invention will be described with reference to FIG. 16 which is a cross sectional schematic view of a circuit board core material. The capacitor element, 109, comprises a ceramic capacitor, 1605. The external terminations, 1604, of the ceramic capacitor are laminated to the clad layers, 1601 and 1602, which function as anode and cathode conductors to form an electrical connection with, but not limited to, previously described methods.

Figure 17:
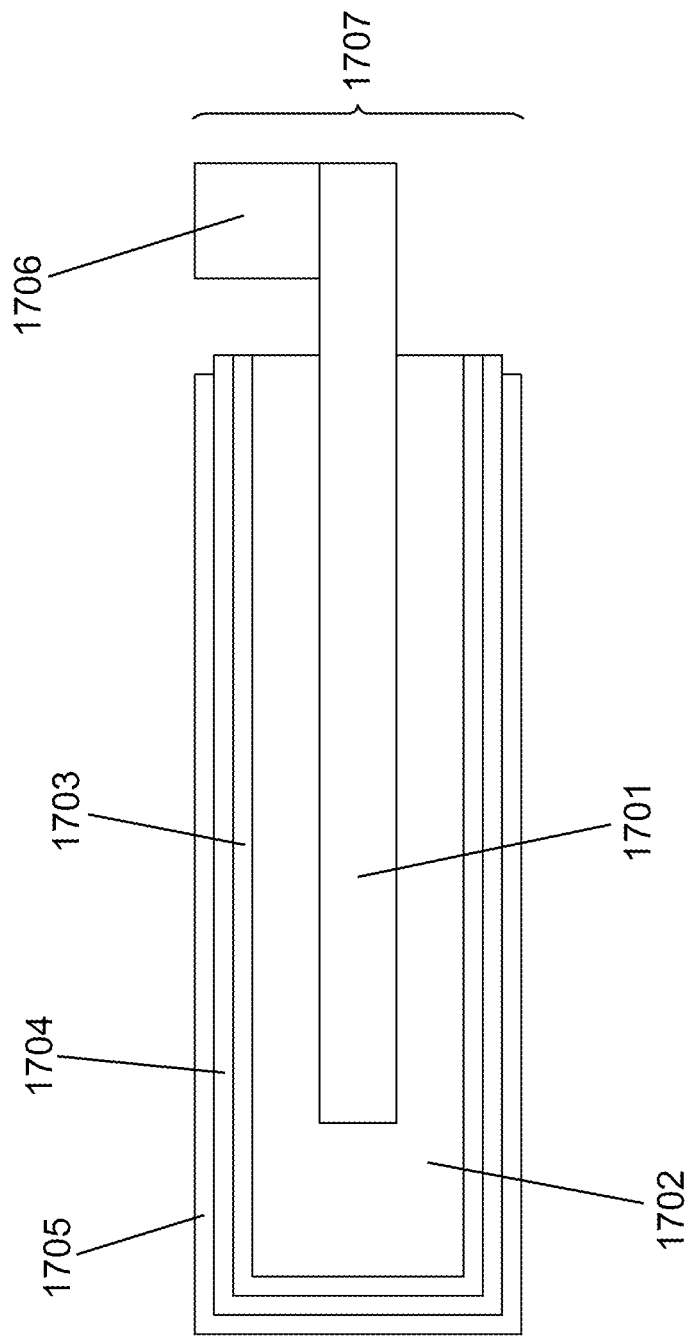
FIG. 17 is a cross sectional schematic view of a press powder based capacitor element.

An embodiment of the invention will be described with reference to FIG. 17 which shows a cross sectional schematic view of a press powder based capacitor, 1707, which can be used as a capacitor element in the instant invention. This press powder based capacitor, 1707, comprises an anode powder, 1702, preferably tantalum pressed and sintered around an anode wire, 1701. A pressed powder capacitor comprises an anode which is formed from a powder which is pressed to form a monolith and then sintered. The anode powder is anodized to form a dielectric on the surface of the inside porosity of the anode powder. Particularly preferred powders include aluminum, tantalum, niobium and conductive niobium oxide (NbO) with tantalum being preferred. A conductive cathode material, 1703, is formed on the inside of the porosity and covers the dielectric wherein the dielectric electrically isolates the conductive cathode material from the anode. A cathode conductive paint, 1704 is formed on the surface of the external conductive cathode material, 1703, and a metalized cathode layer, 1705 is formed on the surface of the conductive paint, 1704 as metallized cathode layer, 1705, functions as the cathode termination. A conductive node, 1706, is electrically connected to the anode wire, 1701. It is preferred that this conductive node is a material that is compatible with the anode and the further processing of the capacitor core. Common materials are copper or nickel, but not limited thereto.

Figure 18:
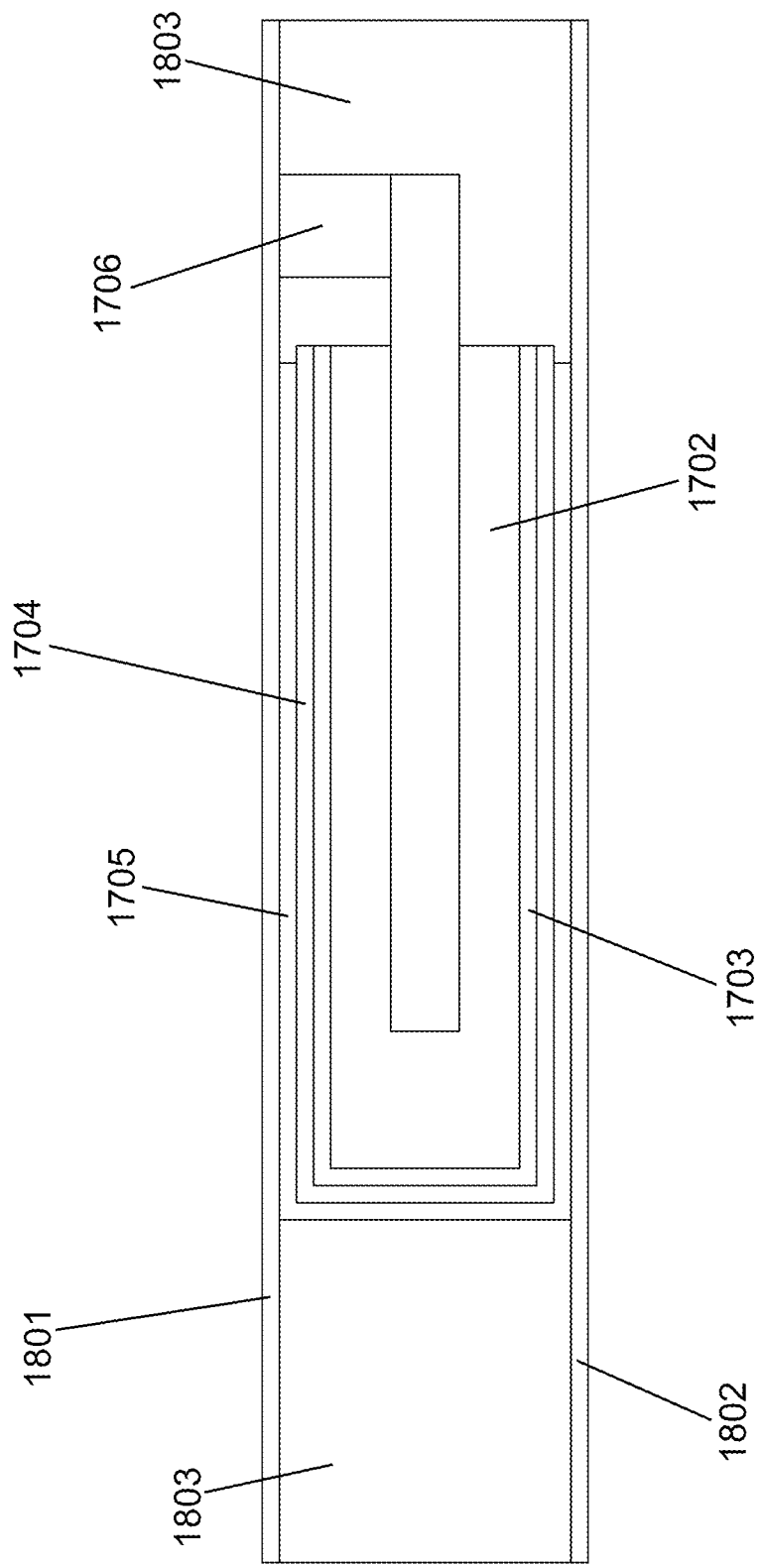
FIG. 18 is a cross sectional schematic view of a press powder based capacitor element in a circuit board core material.

An embodiment of the invention will be described with reference to FIG. 18 which shows a cross sectional schematic view of a circuit board core material using a press powder based capacitor, 1707, as the capacitor element. The press powder based capacitor, 1707, is electrically connected to clad layers, 1801 and 1802, by lamination. The metalized cathode layer, 1705, is connected to clad layer, 1801, and clad layer, 1802 in the laminate. The conductive node, 1706, is connected to core clad layer, 1801. The cured prepreg, 1803, would secure the press powder based capacitor. Many orientations and arrangements are possible in how the capacitor layers and the copper clad layers are arranged. Additionally, multiple capacitor elements, or other electrical components, can be arranged in the same device. As would be realized to those of skill in the art the clad layers, 1801 and 1802, would be etched during the process of trace formation to ensure the cathode and anode are not in electrical contact.

Figure 19:
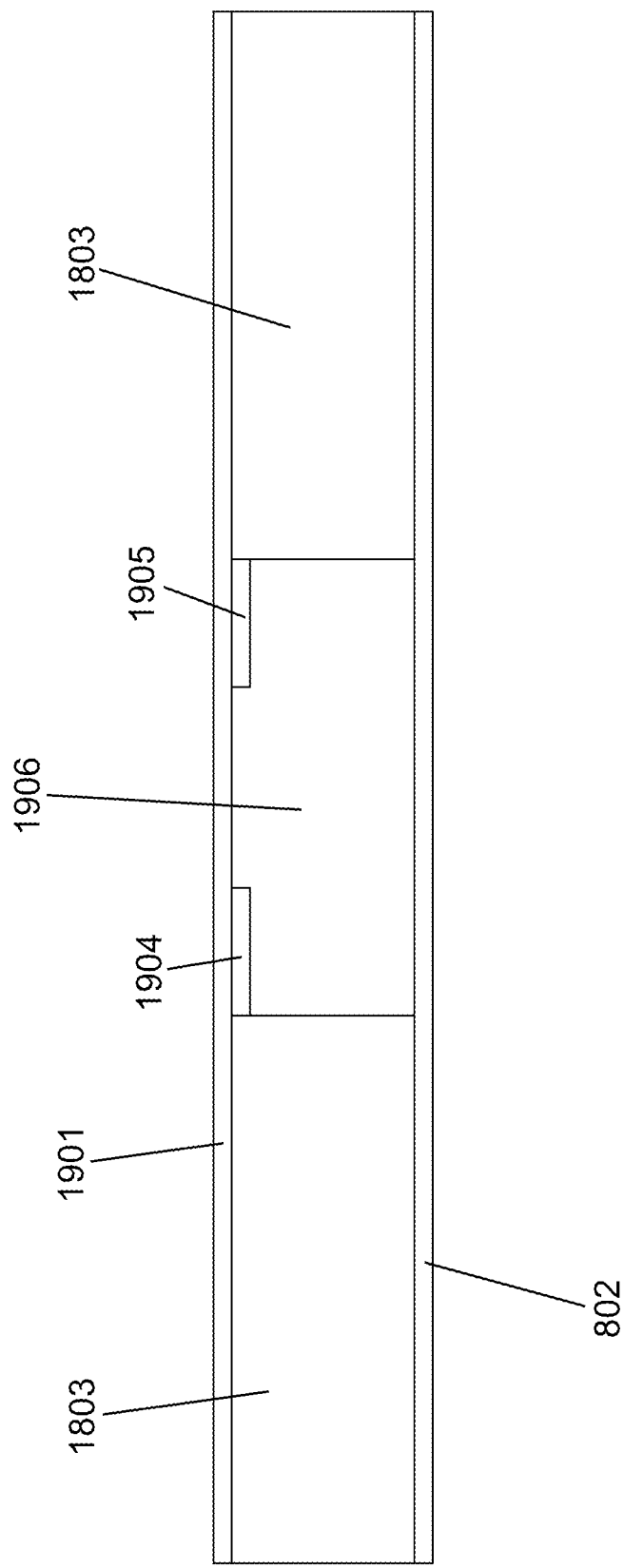
FIG. 19 is a cross sectional schematic view of a press powder based capacitor in a circuit board core material.

An embodiment of the invention will be described with reference to FIG. 19 which shows a cross sectional schematic view of a circuit board core material using a valve metal capacitor, 1906, as the capacitor element. The terminal leads, 1904 and 1905, of the valve metal capacitor, 1906, are electrically connected to the copper clad layer, 1901, by lamination wherein the copper clad layer, 1901, functions as an anode conductor and a cathode conductor after etching. As would be realized to those of skill in the art the clad layer, 1901, would be etched during the process of trace formation to ensure the cathode and anode are not in electrical contact.

Figure 20:
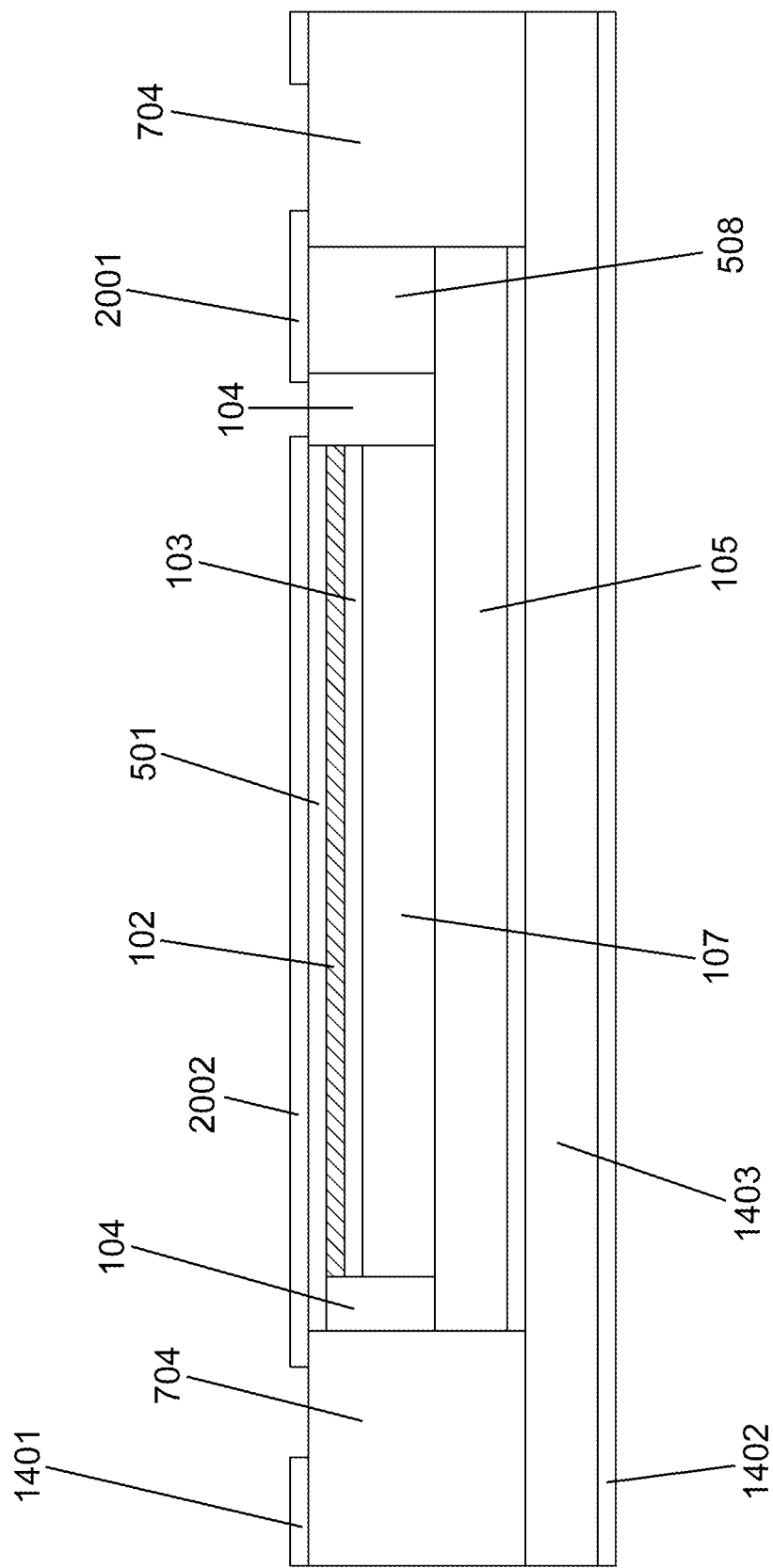
FIG. 20 is a cross sectional schematic view of a one-sided capacitor element in the circuit board core material with patterned traces formed in one of the clad layers.

An embodiment of the invention will be described with reference to FIG. 20 which shows a cross sectional schematic view of a circuit board core material using a capacitor element In this embodiment the one-sided valve metal capacitor is electrically connected to the anode portion of clad layer, 2001, by lamination wherein the, preferably copper, clad layer has been etched to pattern the clad layer thereby allowing anode portion of clad layer, 2001, to function as the anode. The cathode portion of clad layer, 2002, is in electrical contact with the metallized carbon, 501, to from the cathode. In this embodiment the etching pattern provides an electrical separation between the anode and cathode portions of the one-sided capacitor element, along with forming traces that allow for various connection or operation of a printed circuit board. This figure represents the capacitor core processed so the anode and cathode portions are separated with regards to the clad layers. It should be understood that the device may also be considered complete without this patterned etching as it can be made functional at later steps by separating the anode and cathode portions.

Figure 21:
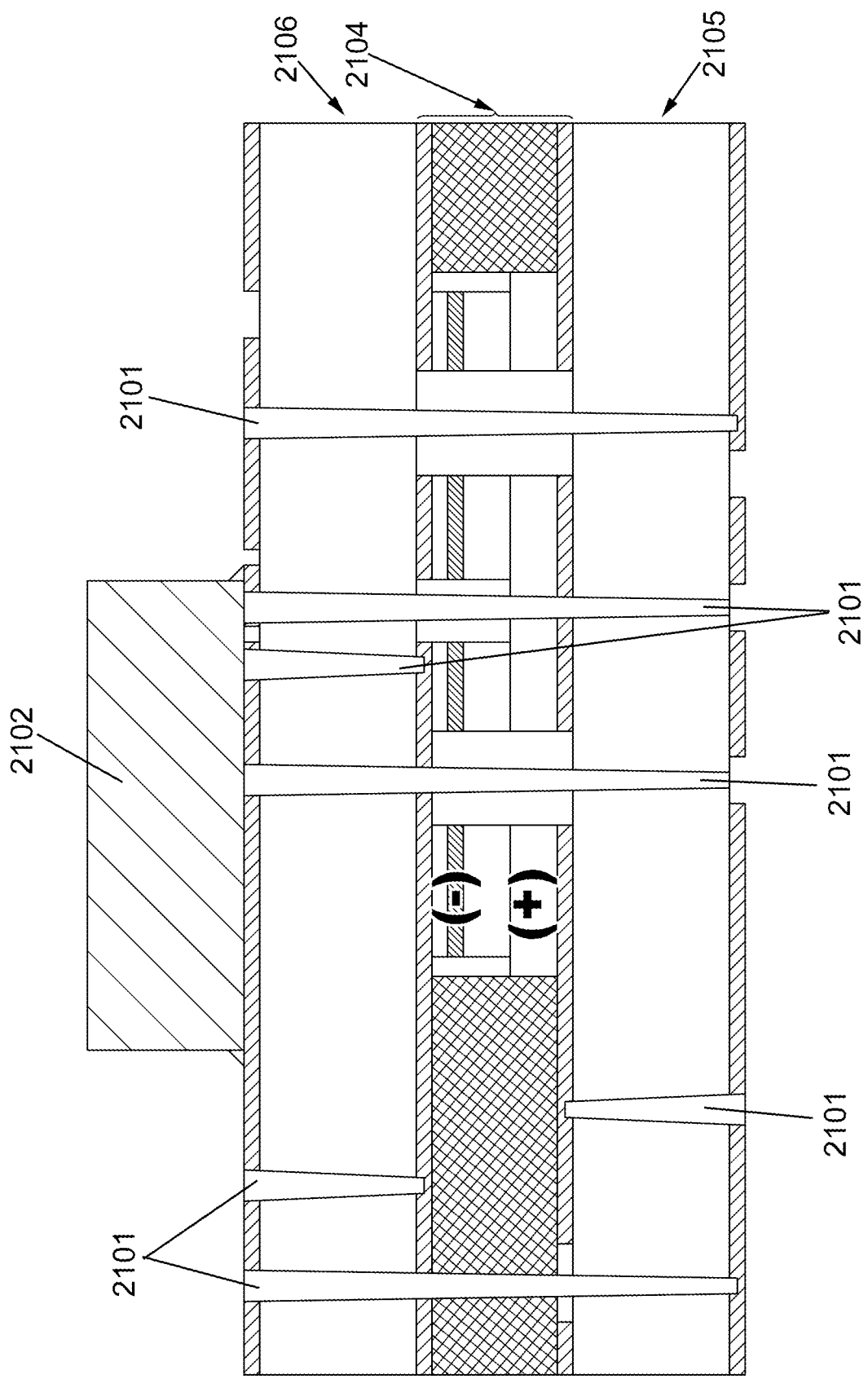
FIG. 21 is a cross sectional schematic view of a circuit board core material used in a multilayer circuit board.

A particularly advantageous embodiment of the invention is the suitability for use in the application of printed circuit board (PCB) which will be described with reference to FIG. 21. In FIG. 21, the circuit board core material, 2104, is between two additional layers of a printed circuit board, 2105 and 2106 to form a primary laminate. Vias, 2101, form anode and cathode connections to an electrical device, 2102, mounted to the printed circuit board. The electrical device can be a passive electronic component or an active electronic component.

Figure 22:
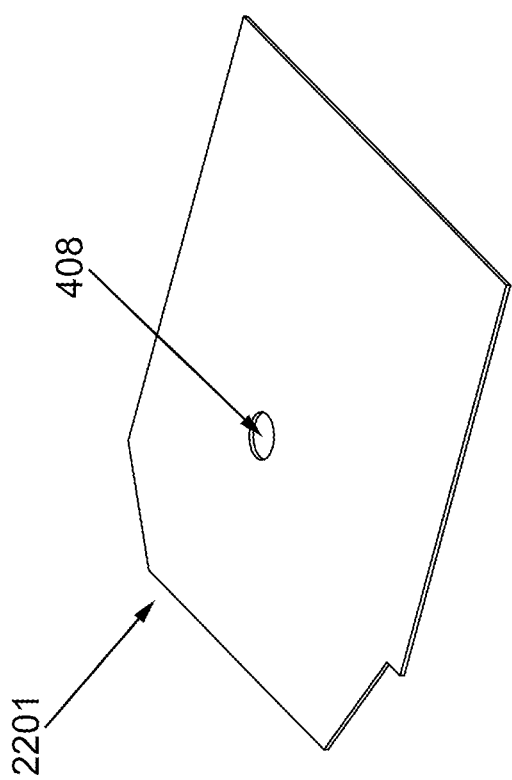
FIG. 22 is a perspective schematic view of a circuit board core material.

An embodiment of the invention will be described with reference to FIG. 22 which shows a perspective schematic view of a circuit board core material, 2201. The shape and location of capacitive element within the circuit board core material are not particularly limited herein. Other features are possible in the present invention.

The valve metal capacitor foil is preferably a substantially planar material made from preferably a valve metal foil that has been treated to increase the surface area of the foil. Commercially this is commonly found in aluminum capacitor foils and recent advances have made tantalum foil of similar construction available. One advantage offered by valve metal foils is the large aspect ratio between two of the material's axes and the third axis, the thickness direction. This forms a sheet of material that passes current well along the core of the sheet. The high surface area is typically present on the face of the sheet like material. The total thickness of commercially available foil matches well with the commercially available prepreg material thicknesses. The foils are also naturally flexible which helps reduce damage during the processing. This flexibility is also a feature desired in the industry such that the cores can be made flexible for the operation of the device or the device may be shaped to fit a non-flat surfaces by being formed to the desired shape.

The porous valve metal layer is a layer on the valve metal wherein the surface area has been increased. For aluminum this is typically done by etching and for tantalum it is typically achieved by sintered fine powders. Inside the porous, high surface area layer, a dielectric can be applied. This is commonly achieved by applying voltage to the valve metal and growing an anodic oxide that covers the surface of the valve metal. That dielectric provides the insulation and dielectric properties for forming the capacitor. A counter electrode material is used to form the cathode side of the capacitor. The cathode is a conductive material that impregnates the porous structure and interacts with the dielectric both physically and electrically. The cathode and anode, with a dielectric between the cathode and anode forms the capacitive couple. It is common for valve metals that the dielectric is polar and the cathode is the region on which the negative charge is present and the valve metal on the opposing side of the dielectric where the positive charge is present. It is not the intent of this invention to limit the scope and as such other capacitive forming constructions are also available. Other materials suitable for demonstration of the invention include, without limited thereto; ceramic, silicon, double layer (supercapacitors), and the like. For valve metal capacitors the conductive material is typically chosen from a material set that is compatible with the dielectric and, in the case of valve metals, preferably has a self-healing nature. This material is commonly conductive polymer or manganese dioxide. Other materials may also provide the desired properties.

The external conductive counter electrode material is an interface layer that provides connection to the internal counter electrode material, such as the valve metal, and supports forming an external surface to contact additional layers. Typically, the external conductive layer can be formed from the same material, and further, from the same processes that form the internal counter electrode layer. This is not limiting as additional materials and variates of those materials are also used to form the external conductive counter electrode materials.

When a conductive polymer is used as the cathode layer the polymer and method of forming the polymer is not limited herein. The polymer layer can be formed by in-situ polymerization, electrochemical polymerization or by the application of and pre-polymerized conductive polymer from a slurry or suspension.

Self-doped conductive polymers are suitable for demonstration of the invention. Self-doped conductive polymers are soluble and completely dissolve in a solvent or solvent mixture without detectable particles. A particle size of below about 1 nm is considered below typical particle size detection limits and therefore defined as soluble. The solvent for the soluble conductive polymer can be water or organic solvents, or a mixture of water with miscible solvents such as alcohol and non-hydroxy polar solvents such as dimethyl sulfoxide (DMSO), dimethylformamide (DMF), dimethylacetamide (DMAc) and the like. A conductive polymer solution potentially can impregnate the pores of anodes as effectively as conductive polymers formed by in-situ methods and better than conductive polymer dispersion with detectable particles. Examples of soluble conductive polymers include conductive polymers of polyanilines, polypyrroles and polythiophenes each of which may be substituted.

A particularly suitable self-doped polymer for demonstration of the invention comprises repeating units represented by Formula A:

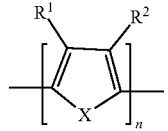

Formula A wherein:
$R^1$ and $R^2$ independently represent linear or branched $C_1$-$C_{16}$ alkyl or $C_2$-$C_{18}$ alkoxyalkyl;
or are $C_3$-$C_8$ cycloalkyl, phenyl or benzyl which are unsubstituted or substituted by $C_1$-$C_6$ alkyl, $C_1$-$C_6$ alkoxy, halogen or $OR^3$; or $R^1$ and $R^2$, taken together, are linear $C_1$-$C_6$ alkylene which is unsubstituted or substituted by $C_1$-$C_6$ alkyl, $C_1$-$C_6$ alkoxy, halogen, $C_3$-$C_8$ cycloalkyl, phenyl, benzyl, $C_1$-$C_4$ alkylphenyl, $C_1$-$C_4$ alkoxyphenyl, halophenyl, $C_1$-$C_4$ alkylbenzyl, $C_1$-$C_4$ alkoxybenzyl or halobenzyl, 5-, 6-, or 7-membered heterocyclic structure containing two oxygen elements. $R^3$ preferably represents hydrogen, linear or branched $C_1$-$C_{16}$ alkyl or $C_2$-$C_{18}$ alkoxyalkyl; or are $C_3$-$C_8$ cycloalkyl, phenyl or benzyl which are unsubstituted or substituted by $C_1$-$C_6$ alkyl with the proviso that at least one of $R^1$ or $R^2$ is substituted with —$SO_3M$, —$CO_2M$ or —$PO_3M$ wherein M is H or a cation preferably selected from ammonium, sodium, lithium or potassium;

X is S, N or O and most preferable X is S;

$R^1$ and $R^2$ of Formula A are preferably chosen to prohibit polymerization at the β-site of the ring as it is most preferred that only α-site polymerization be allowed to proceed; it is more preferred that $R^1$ and $R^2$ are not hydrogen and more preferably, $R^1$ and $R^2$ are α-directors with ether linkages being preferable over alkyl linkages; it is most preferred that the $R^1$ and $R^2$ are small to avoid steric interferences.

In a particularly suitable conductive polymer the $R^1$ and $R^2$ of Formula A are taken together to represent —O—$(CHR^4)_n$—O— wherein:

n is an integer from 1 to 5 and most preferably 2;

$R^4$ is independently selected from a linear or branched $C_1$ to $C_{18}$ alkyl radical $C_5$ to $C_{12}$ cycloalkyl radical, $C_6$ to $C_{14}$ aryl radical $C_7$ to $C_{18}$ aralkyl radical or $C_1$ to $C_4$ hydroxyalkyl radical, wherein $R^4$ is substituted with —$SO_3M$, —$CO_2M$ or —$PO_3M$ and optionally substituted with at least one additional functional group selected from carboxylic acid, hydroxyl, amine, substituted amines, alkene, acrylate, thiol, alkyne, azide, sulfate, sulfonate, sulfonic acid, imide, amide, epoxy, anhydride, silane, and phosphate; hydroxyl radical; or $R^4$ is selected from —$(CHR^5)_a$—$R^{16}$; —$O(CHR^5)_aR^{16}$; —$CH_2O(CHR^5)_aR^{16}$; —$CH_2O(CH_2CHR^5O)_aR^{16}$, or $R^4$ is —$SO_3M$, —$CO_2M$ or —$PO_3M$;

$R^5$ is H or alkyl chain of 1 to 5 carbons optionally substituted with functional groups selected from carboxylic acid, hydroxyl, amine, alkene, thiol, alkyne, azide, epoxy, acrylate and anhydride;

$R^{16}$ is —$SO_3M$, —$CO_2M$ or —$PO_3M$ or an alkyl chain of 1 to 5 carbons substituted with —$SO_3M$, —$CO_2M$ or —$PO_3M$ and optionally further substituted with at least one functional group selected from carboxylic acid, hydroxyl, amine, substituted amines, alkene, thiol, alkyne, azide, amide, imide, sulfate, amide, epoxy, anhydride, silane, acrylate and phosphate;

a is integer from 0 to 10; and

M is a H or cation preferably selected from ammonium, sodium, lithium or potassium.

Exemplary self-doped conductive polymers are represented by S1 and S2.

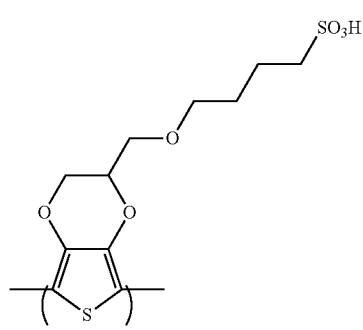

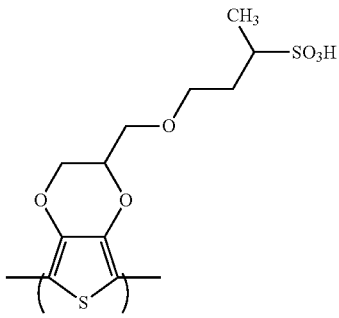

S1 is a commercial polymer as a 2% solution in water. S2 is a commercial polymer as a 2% solution in water.

Self-doped conductive polymers can be formed in-situ by polymerization of monomers during deposition of the self-doped conductive polymer as well known in the art. It is preferable to use previously prepared self-doped conductive polymer wherein the self-doped conductive polymer is formed, preferably, in the presence of functional additives. Preformed self-doping conductive polymers are preferable due to reduced current leakage and an increase in breakdown voltage.

The conductive paint layer is common in the industry of valve metal capacitors. These conductive paints provide an electrical connection between cathode layers. They also prevent damage of adjacent layers and other layers that can occur if the layers are incompatible. Additionally, they may improve the physical or electrical performance of the capacitor. In the case of valve metal capacitors, it is common that conductive paint layers include a carbon ink layer deposited on the surface of the conductive polymer layer, and a metal filled resin system deposited on the carbon ink. While those are common in the industry, they are not the only methods and materials used and any conductive coating which provides a conductive interface within the cathode layers is suitable for use.

The isolation material is commonly used in capacitor manufacturing to limit the areas for any cathode materials to be present. This includes limiting the presence of the cathode material in the porous valve metal layer and external surfaces. Regions that are surrounded by isolation material are commonly used to form areas of the valve metal structure that contain the cathode materials and define the capacitance areas. These isolation materials may also be chosen in such a manner as to support either cathode or anode regions so as to help isolate those regions electrically in any direction or plane of the device.

The anode conductive layer is a layer formed on the region of the capacitor core, preferably on the anode portion of the capacitor element, that provides electrical and physical properties that are favorable for electrical connection between the core and external copper clad layer. One aspect of this is the choice of material and its interaction with the processes that form the electrical connection between the anode and the copper clad layer. One embodiment of the present invention is the use of copper plating on plastic to bridge the electrical gap that may exist after curing the prepreg layers and copper clad layers. During that curing step the layers are compressed and heated and the resin in the prepreg flows to bond to the capacitor element to form a laminate. The copper clad layer and the anode portion of the capacitor element at this stage are not electrically connected. One embodiment for this connection is common methods involving plating on plastics. In modern circuit board production processes this is done using a series of chemical dips that end with a copper plating process. The anode valve metal materials are not always compatible with those processes and will result in damage to the capacitor or poor electrical connection. A more preferred method is to provide an anode conductive layer that is compatible with the PCB plating processes, ideally copper is the most common material without limit thereto. It is not the intent of the current invention to limit this material set or its absence or presents as processing methods may exist and be acceptable to either users or manufactures of the circuit board core material that do not require the use of the anode conductive layer. The use of the anode conductive layer is a variant chosen to best match the final end use, but is not required in the present invention.

The anode isolating regions and cathode isolating regions, also referred to as pass throughs, for the respective anode or cathode, are regions formed in such a manner that when a through via or similar process is used to access the anode or cathode portion of the capacitor element the through via does not intersect the cathode portions if an anode via is desired, or anode portions if a cathode via is desired. Prior art embedded capacitor designs rely on the use of blind vias to connect to the capacitor anode or cathode layers. Blind vias are more complex than through vias, and an advantage of the invention is to mitigate the necessity of using complex blind vias by allowing through vias to work in the same region of the capacitor without the negative impact of electrical bridging between the anode and cathode. This feature can be formed by many methods including, but not limited to, forming isolating material to prevent the presence of cathode or anode material from being formed in the process or the removal of material at any stage in the manufacturing of the device.

In some applications at the customer level it may be desirable to pass non-interacting vias through the capacitors. These vias can carry signals or serve other electrical purpose but are not intended to interact with the capacitor portion of the circuit board core material. It may be required by a design that this must happen where the capacitor is also required in the circuit. To facilitate this a portion of the capacitor element may be formed with no anode or cathode portions present in a region. This pass-through region would allow vias to pass through the capacitor without intersecting its electrical portions. This can be achieved by, but is not limited to, leaving a portion of the capacitor element free of material or processing in such a way as nonconductive material that does not have an electrical connection are present where the vias are intended. It is possible that portions of either the anode or cathode may be left in this region, but are electrically isolated from the capacitor.

For simplicity it is stated in figure, description, and examples that the circuit board core material uses a prepreg material to form its nonconductive portions. While this material is the most advantageous due to commonality, cost, compatibility, and other factors, it is not the purpose of this present invention to limit the scope to only the use of prepreg materials. Any material that electrically isolates the two copper clad layers can be used to achieve the goal. A prepreg is advantageous since it serves the purpose of this isolation between clad layer, and also bonds and protects portions of the capacitor elements. This can be achieved with other materials including, but not limited to, glass, resin only, or any other isolating material. The circuit board core material formed in the examples using prepreg may also be formed using a plurality of materials wherein any of the materials can serve any purpose related to the core. Where the term prepreg is used it should be assumed that these other material types and processes can be substituted by similar components or combinations of resins and related materials and additives. It is known to one of skilled in the art that prepreg systems contain an, at least partially, uncured resin. That resin is cured as part of the lamination steps described in the present invention. The term cured use in the present invention does not limit the scope of the material or its processes. Additional but not limiting descriptors of cured include, adhesives (requiring no further curing), potting, thermosetting, tacking, press fitting, support from other elements, or other processes that secure the capacitor element to the prepreg layer.

Clad layers are conductive layers, preferably comprising copper, that form opposing sides of the prepreg material. Circuit board core material in the PCB industry has copper material bonded to both sides of a cured prepreg material. These copper layers are commonly manufactured as films of copper that are compressed and fused to both sides of the prepreg material during the curing step for the prepreg. This results in a thin sheet of material that has two isolated layers of copper on opposing sides. Customers will typically drill vias, plate the vias, and then etch away unwanted copper to form pads and traces for further layer lamination or final use of the circuit. These clad layers in the current invention are intended to work to provide common functionality of the clad layers while also being incorporated with the capacitor elements present in the internal layer of prepreg. While it may be common for these clad layers to be formed from preformed sheets of copper any method of creating a useable conductive layer for the customer is considered part of the present invention. This layer may be of other materials or may be applied in different methods such as, but not limited to, plating on plastic or sputtering.

The pocket described in the present invention is one embodiment of how to form the present invention. It is one purpose of this present invention to avoid the use of blind vias to access the capacitor element embedded in internal layers, as is common in the art, by removing the presence of the barrier between the clad layers and capacitor element terminations, wherein the capacitor element terminations and the clad layers are substantially planar. In that event the vias are not necessary to form electrical connection to the capacitors. This saves complexity and thickness of the overall part design. While there are other methods to achieve the desired results, forming a pocket in the uncured prepreg layers facilitates both the reduction in via and thickness and also facilitates the capacitor element bonding to the inner layers.

The present invention avoids the need for prepreg or vias between the clad layers and the capacitor element. To facilitate the connection between those layers a clad bonding layer may be implemented. This is a layer formed between the electrical surface of the capacitor elements and the clad layers. The material could be applied directly to the capacitor elements or clad layers, or it could be an independent material added during the lamination between the two layers. This clad bonding layer may be selected from, but not limited to, metal filled resin system, solder, transient liquid phase solders, sintered metal powders, or anisotropic conductive films or any material that forms a electrical connection between the capacitor element and the clad layers.

An additional method to connect the capacitor element and clad layers is the use of an electrical connection layer. This layer is formed after curing the prepreg layer with the capacitor elements and clad layers. Ideally this is a plated copper layer that spans the potentially physical or electrical gap present between the capacitor element and clad layers after the curing and assembly of the prepreg, clad layers, and capacitor elements. While this is the preferred method, other methods are contemplated within the invention, including forming the circuit board core material assembly with only the prepreg and capacitor elements and forming the electrical connection and clad layers from the same electrical connection layer, such as plating copper. This electrical connection layer is preferably copper and more preferably plated, but may be selected from any conductive material compatible with the capacitor elements and clad layers. Methods to apply this electrical connection layer, include but are not limited to, plating, sputtering, chemical vapor deposition, flame spray, arc spray, or sintering.

As described in this invention the connection to the capacitor element to surface conductors provides an embedded capacitor within a laminate. It would be known to one skilled in the art that the meaning of that connection would be that at least a portion of the cathode layers of the capacitor element are connected to one portion of the clad layers and at least a portion of the anode layers of the capacitor element is connected to at least a separate portion of the clad layers. In a preferred embodiment the anode and cathode portions are connected to different clad layers on opposing sides of the prepreg material. However, also provided by the instant invention is a construction wherein the cathode and anode portions of the capacitor element can be connected to the same clad layer as preferred in the design of the final device. This connection is any method by which physical and electrical connection is made. While this may result in a nonfunctioning capacitor to one skilled in the art, the prepreg and cladding is designed to be post processed at the customer level and that processing can result in the electrically shorted cathode and anode portions of the capacitor being separated, resulting in a functional device.

In this present invention capacitors have been used as the example device, and more preferably valve metal capacitors. Capacitors are particularly advantageous to demonstrate the invention, however, other passive components could be utilized in the place of a capacitor throughout the description. Particularly advantageous are the thinner overall finished core for the same value of capacitance, lack of blind via processing, and common processing technology. Furthermore, multiple components can be utilized in a similar manner wherein the multiple components are electrically connected, to provide functionality, or the multiple components are electrically independent. Particularly preferred components are selected from the group consisting of ceramic capacitors, valve metal capacitors, resistors, resistor films, active silicon dies, diodes, inductive materials, magnetic devices, or other electrical components that can benefit from very thin core structure described in the present invention.

Manufacturing the present invention incorporates existing techniques and therefore the invention can be demonstrated without significant alteration or replacement of manufacturing facilities and equipment.

EXAMPLES

Example 1

In a representative construction a circuit board core material would be prepared comprising a capacitor as a representative electronic component. The capacitor would comprise an anode with porous layer with and a dielectric thereon. An isolation material would be formed on a portion of the anode. A conductive polymer layer would be formed on the porous layer wherein the conductive polymer layer would be circumscribed by the isolation material. A carbon ink layer would be formed on the conductive polymer layer. A copper layer would be formed on the carbon ink layer. A copper layer would be formed on the anode layer thereby completing the capacitor. A hole would be cut in a portion of uncured prepreg. A hole would be cut in a portion of a top and bottom copper foil. The prepreg layer and copper foils would be stacked so that the holes aligned. The electronic component, represented by the capacitor, would be placed within the aligned hole of the prepreg and copper foils. The capacitor, prepreg, and copper foils would be laminated under compression so that the copper foils are compressed to the prepreg and the heat of lamination would make the prepreg resin bond to the copper foil and form around the capacitor element. A conductive layer would be formed on a portion of the exposed prepreg resin. Copper plating would be formed on the prepreg, copper foils, and capacitor elements so that the copper plating bridges between the capacitor element and the copper foils.

Example 2

In a representative construction a circuit board core material would be prepared comprising a capacitor as a representative electronic component. A capacitor would be formed comprising an anode with a porous layer and a dielectric on the porous layer. An isolation material would be formed on the porous layer. A conductive polymer layer would be formed on the porous layer wherein the conductive polymer layer is circumscribed by the isolation material. A carbon ink layer would be formed on the conductive polymer layer. A copper layer would be formed on the carbon ink layer. A copper layer would be formed on the anode layer to complete the capacitor element.

A hole would be cut in a portion of uncured prepreg. A conductive paste layer would be formed on the anode and cathode surfaces of the capacitor. The capacitor would be inserted into the hole portion of the prepreg. Copper foils would be applied to both sides of the prepreg and capacitor element. The capacitor, prepreg, and copper foils would be laminated so that the copper foils are compressed to the prepreg and the heat of lamination would make the prepreg resin bond to the copper foil and form around the capacitor. Electrical bonds would be formed between the capacitor and copper foils with conductive paste.

Example 3

In a representative construction a circuit board core material would be prepared comprising a ceramic capacitor as a representative electronic component. A ceramic capacitor would be prepared by forming a plurality of layers of dielectric and conducive plates and fusing a copper glass mixture to opposing ends of the dielectric and conductive plates. The copper glass mixture would form terminals of the ceramic capacitor element. A hole would be cut into a portion of an uncured prepreg. A hole would be cut in a portion of a top copper foil and a bottom copper foil. The prepreg layer and copper layers would be stacked so that the holes aligned. The ceramic capacitor would be inserted into the hole portion of the prepreg and copper foils. The ceramic capacitor, prepreg, and copper foils would be laminated so that the copper foils are compressed to the prepreg and the heat of lamination would make the prepreg resin bond to the copper foil and form around the ceramic capacitor element. A conductive layer would be formed on a portion of the exposed prepreg resin. Copper plating would be formed on the prepreg, the copper foils, and the ceramic capacitor so that the copper plating bridges between the ceramic capacitor terminals and the copper foils.

Example 4

In a representative construction a circuit board core material would be prepared comprising a capacitor as a representative electronic component. An anode would be prepared with a porous layer and a dielectric on the porous layer. An isolation material would be formed on a portion the anode. A conductive polymer would be formed on the porous layer wherein the conductive polymer was circumscribed by the isolation material. A carbon ink layer would be formed on the conductive polymer layer. A copper layer would be formed on the carbon ink layer. A copper layer would be formed on the anode layer in plane with a portion of the cathode copper layer to form a capacitor element. A hole would be cut in a portion of uncured prepreg. A hole would be cut in a portion of a copper foil. An uncut copper foil layer, an uncut prepreg layer, cut prepreg layer and cut copper foil layer would be stacked so that the holes aligned. The capacitor would be placed within the hole portion of the prepreg and copper foil. The assembly comprising the capacitor element, prepreg, and copper foils would be laminated so that the copper foils are compressed to the prepreg and the heat of lamination would make the prepreg resin bond to the copper foil and form around the capacitor element. A conductive layer would be formed on a portion of the exposed prepreg resin. Copper plating would be formed on the prepreg, copper foils, and capacitor elements so that the copper plating bridges between the capacitor element and the copper foil.

Example 5

In a representative construction a circuit board core material would be prepared comprising a capacitor as a representative electronic component. An anode would be prepared comprising a porous layer with a dielectric thereon. An isolation material would be formed on a portion of the anode. A conductive polymer layer would be formed on the porous layer wherein the conductive polymer layer is circumscribed by the isolation material. A carbon ink layer would be formed on the conductive polymer layer. A copper layer would be formed on the carbon ink layer. A copper layer would be formed on the anode layer to form a capacitor element. A hole would be cut in a portion of uncured prepreg. The capacitor element would be inserted in the hole portion of the prepreg. The capacitor element and prepreg would be laminated so that the heat of lamination would make the prepreg resin form around the capacitor element. A conductive layer would be formed on a portion of the exposed prepreg resin. Copper plating would be formed on the prepreg and capacitor elements to form the copper clad layers.

The invention has been described with reference to preferred embodiments without limit thereto. One of skill in the art would realize additional embodiments which are described and set forth in the claims appended hereto.

The invention claimed is:
1. A circuit board core material comprising:
a laminate comprising:
a resin or resin-glass prepreg layer;
a first clad layer directly on a first side of said prepreg layer wherein said prepreg layer comprises a pocket; and
a capacitor in said pocket wherein said capacitor comprises a porous valve metal and said capacitor comprises a first external termination and a second external termination wherein said first external termination is laminated to and in electrical contact with said first clad layer and said second external termination is laminated to and in electrical contact with a conductor;
wherein said first external termination is a counter electrode and further comprising a conductive paint on said counter electrode; and
further comprising a cathode isolation region.
2. The circuit board core material of claim 1 wherein said prepreg layer is a cured prepreg layer.
3. The circuit board core material of claim 1 wherein said external terminations and clad layer are planar.
4. The circuit board core material of claim 1 further comprising a second clad layer on a second side opposite said first side.
5. The circuit board core material of claim 1 wherein said capacitor is selected from a foil capacitor, a pressed powder capacitor, and a ceramic capacitor.
6. The circuit board core material of claim 1 wherein said capacitor comprises a dielectric on said porous valve metal layer.
7. The circuit board core material of claim 1 wherein said valve metal is selected from the group consisting of aluminum, tantalum, niobium and NbO.
8. The circuit board core material of claim 1 wherein said porous valve metal layer is a foil.
9. The circuit board core material of claim 1 wherein said capacitor comprises a metalized cathode layer.
10. The circuit board core material of claim 1 wherein said conductive paint comprises at least one of a carbon filled resin or a metal filled resin.
11. The circuit board core material of claim 1 wherein said first clad layer comprises copper.
12. The circuit board core material of claim 1 further wherein said cathode isolation region comprises an isolation material.
13. The circuit board core material of claim 1 further comprising an anode isolation region.
14. The circuit board core material of claim 13 further wherein said anode isolation region comprises an isolation material.
15. The circuit board core material of claim 1 further comprising a via pass through section.
16. The circuit board core material of claim 1 further comprising a conductive node.
17. The circuit board core material of claim 16 wherein said conductive node is an anode conductive node.
18. The circuit board core material of claim 1 comprising multiple electronic components.
19. The circuit board core material of claim 1 further comprising at least one clad bonding layer.
20. The circuit board core material of claim 1 further comprising at least one electrical connection layer between adjacent said external termination and clad layer.
21. The circuit board core material of claim 1 further comprising a prepreg layer laminated on opposite side of said capacitor from first clad layer.
22. The circuit board core material of claim 1 wherein said first clad layer has been etched.
23. The circuit board core material of claim 1 wherein said circuit board core material is flexible.

24. A circuit board comprising:
a primary laminate comprising:
a circuit board core material layered with circuit board material wherein said circuit board material is laminated to said circuit board core material to form said laminate wherein said circuit board core material comprises:
a laminate comprising:
a resin or resin-glass prepreg layer;
a first clad layer directly on a first side of said prepreg layer wherein said prepreg layer comprises a pocket; and
a capacitor in said pocket wherein said a capacitor comprises a porous valve metal layer and said capacitor comprises a first external termination and a second external termination wherein said first external termination is laminated to and in electrical contact with said first clad layer and said second external termination is in electrical contact with a conductor;
wherein said first external termination is a counter electrode and further comprising a conductive paint on said counter electrode; and
further comprising a cathode isolation region.

25. The circuit board of claim 24 wherein said prepreg layer is a cured prepreg layer.

26. The circuit board of claim 24 wherein said external terminations and clad layer are planar.

27. The circuit board of claim 24 further comprising a second clad layer on a second side of said prepreg layer opposite said first side.

28. The circuit board of claim 24 further comprising at least one via.

29. The circuit board of claim 24 further comprising at least one electronic component on said circuit board.

30. The circuit board of claim 24 wherein said capacitor is selected from a foil capacitor, a pressed powder capacitor and a ceramic capacitor.

31. The circuit board of claim 24 wherein said capacitor comprises a dielectric on said porous valve metal layer.

32. The circuit board of claim 24 wherein said valve metal is selected from the group consisting of aluminum, tantalum, niobium and NbO.

33. The circuit board of claim 24 wherein said porous valve metal layer is a foil.

34. The circuit board of claim 24 wherein said capacitor comprises a metalized cathode layer.

35. The circuit board of claim 24 wherein said conductive paint comprises at least one of a carbon filled resin or a metal filled resin.

36. The circuit board of claim 24 wherein said first clad layer comprises copper.

37. The circuit board of claim 24 further wherein said cathode isolation region comprises an isolation material.

38. The circuit board of claim 24 further comprising an anode isolation region.

39. The circuit board of claim 38 further wherein said anode isolation region comprises an isolation material.

40. The circuit board of claim 24 further comprising a via pass through region.

41. The circuit board of claim 24 further comprising a conductive node.

42. The circuit board of claim 41 wherein said conductive node is an anode conductive node.

43. The circuit board of claim 24 comprising multiple electronic components.

44. The circuit board of claim 24 further comprising at least one clad bonding layer.

45. The circuit board of claim 24 further comprising at least one electrical connection layer between adjacent said external termination and clad layer.

46. The circuit board of claim 24 further comprising a prepreg layer laminated on opposite side of capacitor from first clad layer.

47. The circuit board of claim 24 wherein said first clad layer has been etched.

48. The circuit board of claim 24 wherein said circuit board core material is flexible.

* * * * *